United States Patent
Yang et al.

(10) Patent No.: US 12,027,583 B2
(45) Date of Patent: Jul. 2, 2024

(54) GATE STRUCTURES FOR SEMICONDUCTOR DEVICES

(71) Applicant: Taiwan Semiconductor Manufacturing Co., Ltd., Hsinchu (TW)

(72) Inventors: Chansyun David Yang, Shinchu (TW); Keh-Jeng Chang, Shinchu (TW); Chan-Lon Yang, Taipei (TW); Perng-Fei Yuh, Walnut Creek, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 233 days.

(21) Appl. No.: 17/320,170

(22) Filed: May 13, 2021

(65) Prior Publication Data

US 2022/0367627 A1 Nov. 17, 2022

(51) Int. Cl.
*H01L 29/66* (2006.01)
*H01L 21/8234* (2006.01)
*H01L 29/06* (2006.01)
*H01L 29/78* (2006.01)

(52) U.S. Cl.
CPC .. *H01L 29/0673* (2013.01); *H01L 21/823418* (2013.01); *H01L 21/823431* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2018/0122703 A1* | 5/2018 | Cheng | H01L 29/78696 |
| 2019/0237464 A1* | 8/2019 | Ching | H01L 29/785 |
| 2021/0043727 A1* | 2/2021 | Frougier | H01L 29/66553 |
| 2021/0184002 A1* | 6/2021 | Wu | H01L 29/7856 |
| 2022/0085161 A1* | 3/2022 | Noh | H01L 27/092 |
| 2022/0108989 A1* | 4/2022 | Kang | G11C 11/412 |

* cited by examiner

*Primary Examiner* — Joseph C. Nicely
*Assistant Examiner* — Lamont B Koo
(74) *Attorney, Agent, or Firm* — Sterne, Kessler, Goldstein & Fox P.L.L.C.

(57) ABSTRACT

A semiconductor device with different configurations of gate structures and a method of fabricating the semiconductor device are disclosed. The semiconductor device includes a stack of nanostructured channel regions disposed on a fin structure, a first gate structure disposed within the stack of nanostructured channel regions, a second gate structure surrounds the first gate structure about a first axis and surrounds the nanostructured channel regions about a second axis different from the first axis, and first and second contact structures disposed on the first and second gate structures, respectively.

20 Claims, 44 Drawing Sheets

GATE STRUCTURES FOR SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIG. 1I illustrates an isometric view of a stack of nanostructured channel regions with through-channel gate (TCG) structures, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
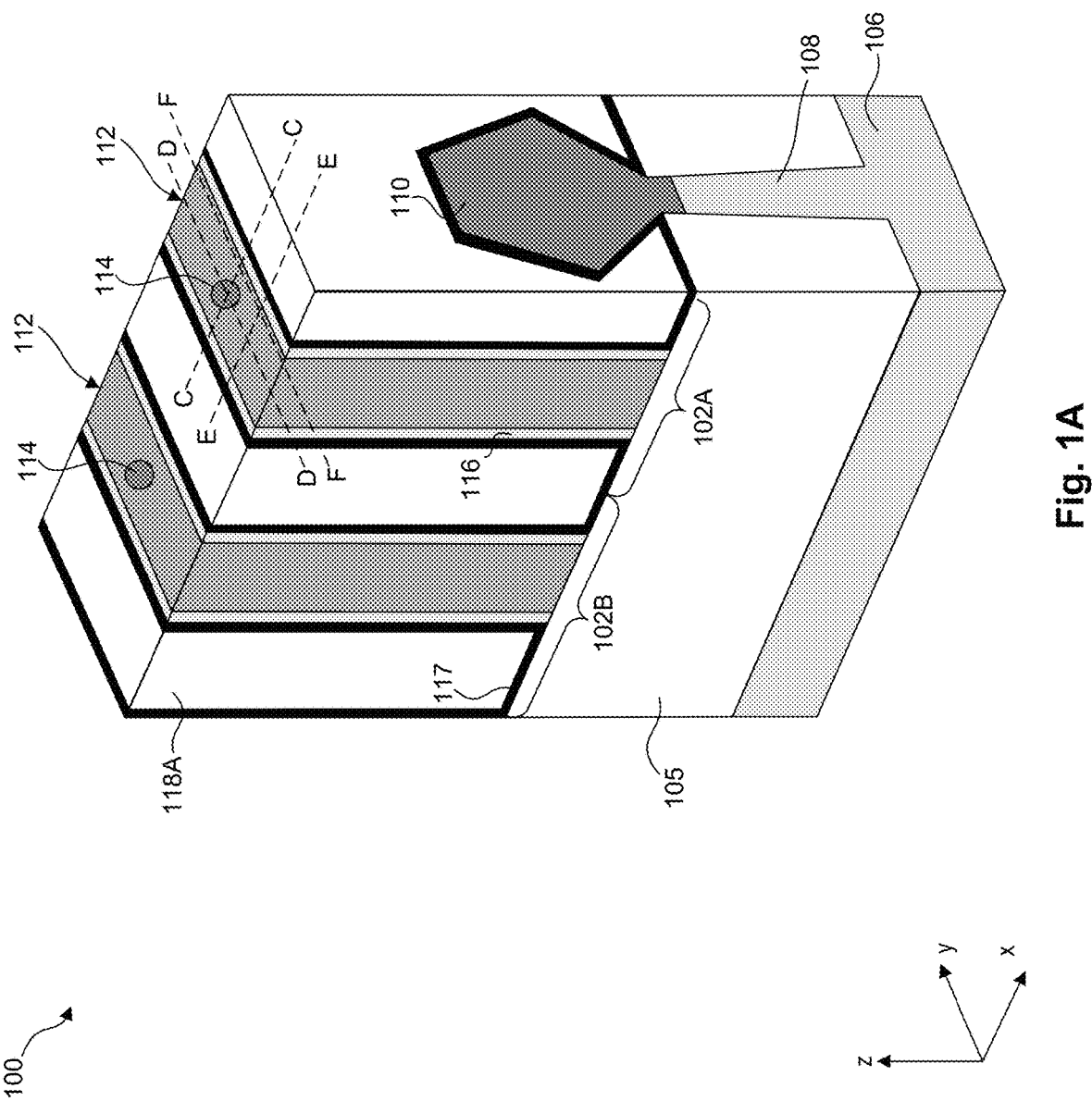
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

With the increasing demand for multi-functional portable devices, there is an increasing demand for FETs with different threshold voltages (Vt) on the same substrate. One way to achieve such multi-Vt devices can be with different work function metal (WFM) layer thicknesses in the FET gate structures. However, the different WFM layer thicknesses can be constrained by the FET gate structure geometries. For example, in gate-all-around (GAA) FETs, the WFM layer thicknesses can be constrained by the spacing between the nanostructured channel regions of the GAA FETs. Also, depositing different WFM layer thicknesses can become increasingly challenging with the continuous scaling down of FETs (e.g., GAA FETs and/or finFETs).

The present disclosure provides example FETs (e.g., GAA FETs) with multi-Vt functionality and example methods of forming the same. The multi-Vt functionality can be provided by a plurality of gate structures formed between a pair of source/drain (S/D) regions. In some embodiments, a FET with multi-Vt functionality can include one or more through-channel gate (TCG) structures and a gate-all-around (GAA) structure that are disposed between a pair of S/D regions. The TCG structures can extend through nanostructured channel regions of the FET and can be disposed on a fin structure of the FET underlying the nanostructured channel regions. Portions of the TCG structures can be alternatively surrounded by the nanostructured channel regions and the GAA structure.

In some embodiments, the TCG structures can include negative capacitance gate dielectric layers to prevent or reduce parasitic capacitance between the TCG structures and the GAA structures. By controlling the voltages applied to the GAA structure and the one or more TCG structures, the threshold voltage of the FET can be modulated to achieve different threshold voltages of the FET. With the use of the one or more TCG structures, the threshold voltage of the FET can be tuned to higher voltages during a standby mode of the FET to reduce the leakage current, thus reducing power consumption and improving device performance. In addition, with the use of TCG structures, the number of FETs needed to achieve multiple threshold voltages in an integrated circuit can be reduced, thus reducing device area and manufacturing cost.

Figure 1B:
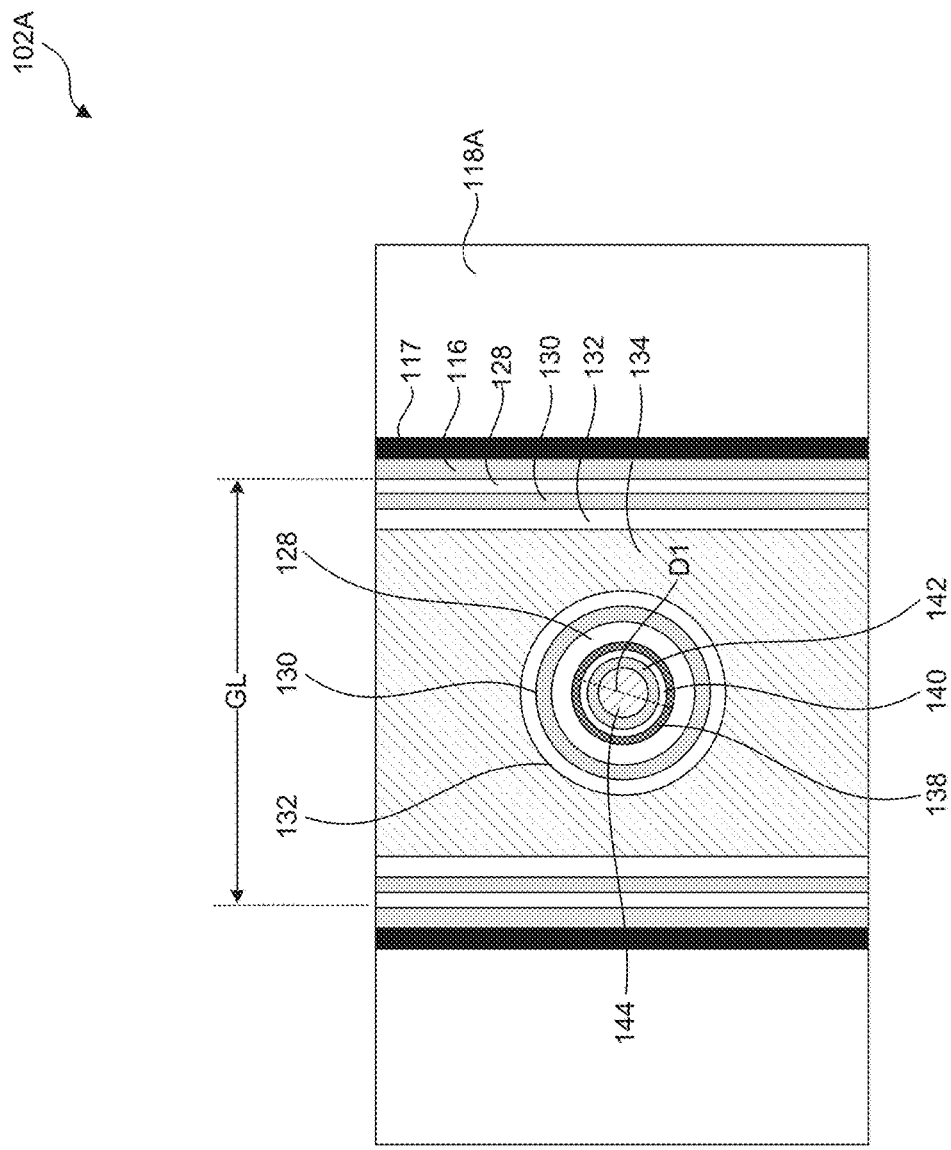
FIG. 1B illustrates a top view of a semiconductor device with different gate structures, in accordance with some embodiments.

A semiconductor device 100 with FETs 102A-102B is described with reference to FIGS. 1A-1F, according to various embodiments. Though two FETs are discussed with reference to FIGS. 1A-1F, semiconductor device 100 can have any number of FETs. FETs 102A-102B can be n-type, p-type, or a combination thereof. FIG. 1A illustrates an isometric view of semiconductor device 100, according to some embodiments. FIG. 1B illustrates a top view of FET 102A with additional elements that are not shown in FIG. 1A for simplicity. FIGS. 1C-1F illustrate cross-sectional views of FET 102A, along lines C-C, D-D, E-E, and F-F of FIG. 1A, with additional elements that are not shown in FIG. 1A for simplicity. The discussion of FET 102A applies to FET 102B, unless mentioned otherwise. The discussion of elements in FIGS. 1A-1F with the same annotations applies to each other, unless mentioned otherwise.

Semiconductor device 100 can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic).

Semiconductor device 100 can further include etch stop layer (ESL) 117, interlayer dielectric (ILD) layers 118A-118B, and shallow trench isolation (STI) regions 105. ESL 117 can be configured to protect gate structures 112 and/or epitaxial source/drain (S/D) regions 110. In some embodiments, ESL 117 can include an insulating material, such as silicon oxide ($SiO_2$), silicon nitride (SiN), silicon carbon nitride (SiCN), silicon oxycarbon nitride (SiOCN), silicon germanium oxide, and any other suitable insulating material. ILD layers 118A-118B can be disposed on ESL 117 and can include a dielectric material.

Referring to FIGS. 1A-1F, in some embodiments, FET 102A can include (i) a fin structure 108, (ii) a stack of nanostructured channel regions 120 (also referred to as "nanostructured layers 120") disposed on fin structure 108, (iii) epitaxial S/D regions 110 disposed on portions of fin structure 108 that are adjacent to nanostructured channel regions 120, (iv) a gate-all-around (GAA) structure 112 disposed on and wrapped around nanostructured channel regions 120, (v) a through-channel gate (TCG) structure 114 disposed on a portion of fin structure 108 underlying nanostructured channel regions 120, (vi) S/D contact structures 126 disposed on epitaxial S/D regions 110, (vii) a GAA contact structure 136, and (viii) a TCG contact structure 146. The term "nanostructured" defines a structure, layer, and/or region as having a horizontal dimension (e.g., along an X- and/or Y-axis) and/or a vertical dimension (e.g., along a Z-axis) less than, for example, 100 nm.

Fin structure 108 can be formed from substrate 106 and can extend along an X-axis. Nanostructured channel regions 120 can include semiconductor materials similar to or different from substrate 106. In some embodiments, nanostructured channel regions 120 can include Si, silicon arsenic (SiAs), silicon phosphide (SiP), silicon carbide (SiC), silicon carbon phosphide (SiCP), silicon germanium (SiGe), silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 120 are shown, nanostructured channel regions 120 can have cross-sections of other geometric shapes (e.g., circular, elliptical, triangular, or polygonal). In some embodiments, nanostructured channel regions 120 can have a thicknesses T1 or a diameter T1 (shown in FIG. 1F) along a Z-axis ranging from about 1 nm to about 8 nm or other suitable dimensions. In some embodiments, nanostructured channel regions 120 can have a length L1 (shown in FIG. 1E) along an X-axis ranging from about 20 nm to about 80 nm or other suitable dimensions. In some embodiments, nanostructured channel regions 120 can have a width W1 (shown in FIG. 1F) along a Y-axis ranging from about 20 nm to about 100 nm or other suitable dimensions. In some embodiments, a ratio of L1:W1 can range from about 1:1 to about 1:2.

Epitaxial S/D regions 110 can be grown on fin structure 108 and can include epitaxially-grown semiconductor materials. In some embodiments, the epitaxially-grown semiconductor material can include the same material or a different material from the material of substrate 106. Epitaxial S/D regions 110 can be n- or p-type. The term "p-type" defines a structure, layer, and/or region as being doped with p-type dopants, such as boron. The term "n-type" defines a structure, layer, and/or region as being doped with n-type dopants, such as phosphorus. In some embodiments, S/D regions 110 can include SiAs, SiC, SiCP, SiGe, SiGeB, GeB, SiGeSnB, a III-V semiconductor compound, any other suitable semiconductor material, or a combination thereof.

In some embodiments, each of S/D contact structures 126 on epitaxial S/D regions 110 can include (i) a silicide layer 124 and (ii) a contact plug 125 disposed on silicide layer 124. In some embodiments, silicide layer 124 can include nickel silicide (NiSi), tungsten silicide ($WSi_2$), titanium silicide ($TiSi_2$), cobalt silicide ($CoSi_2$), or other suitable metal silicides. In some embodiments, contact plug 125 can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), any other suitable conductive material, and a combination thereof.

Figure 1C:
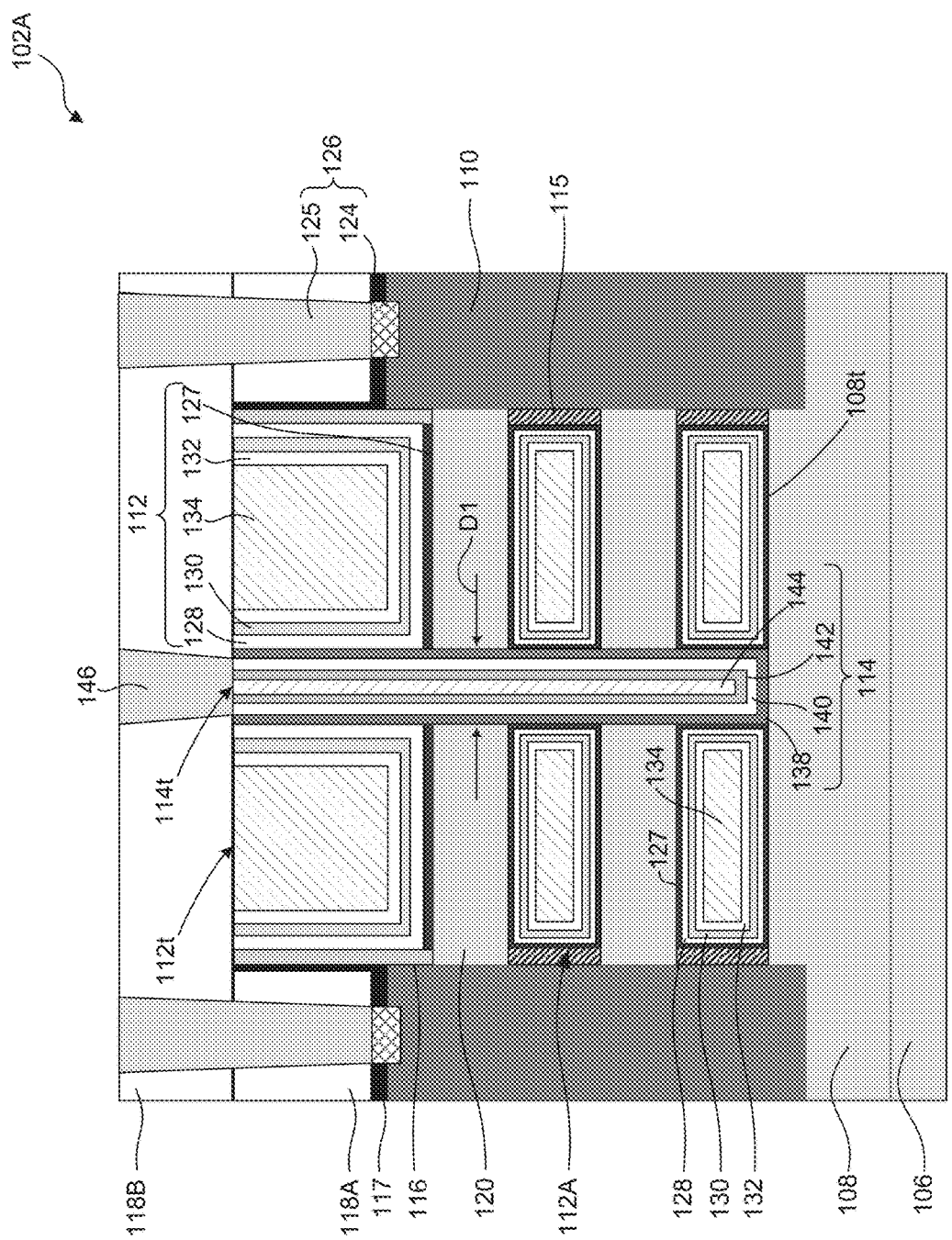
FIGS. 1C-1F illustrate cross-sectional views of a semiconductor device with different gate structures, in accordance with some embodiments.
Figure 1D:
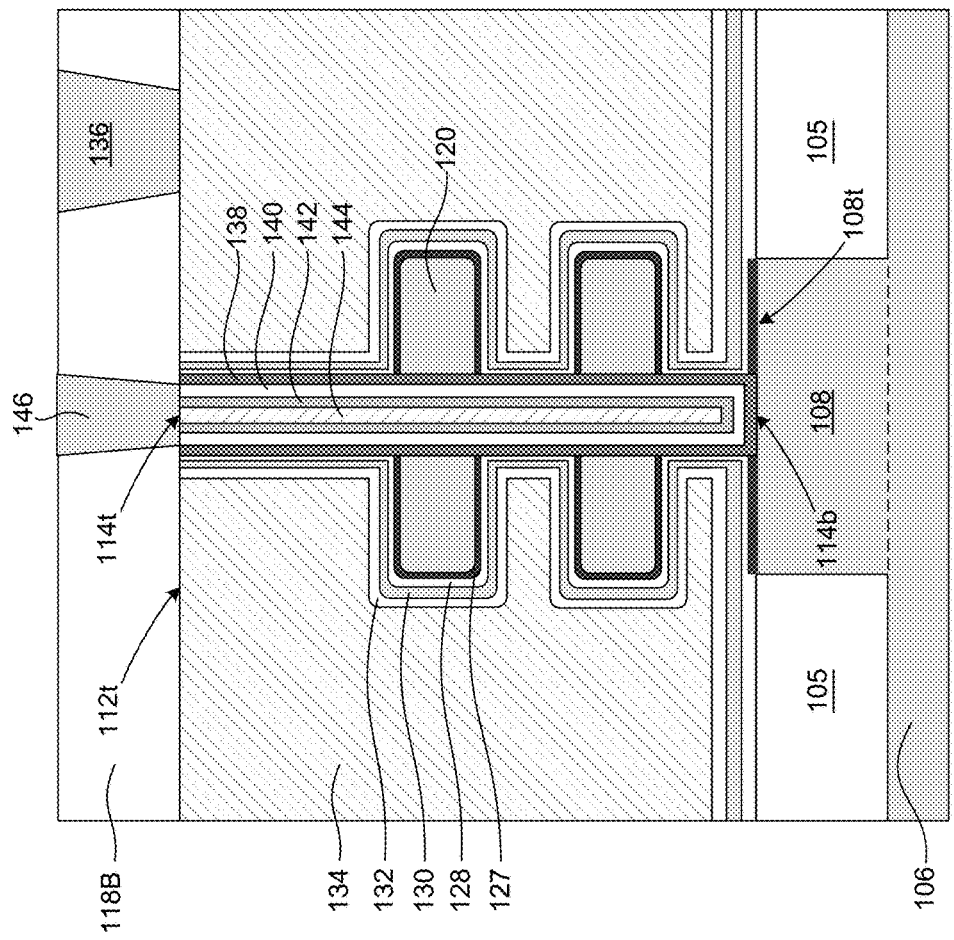
Figure 1E:
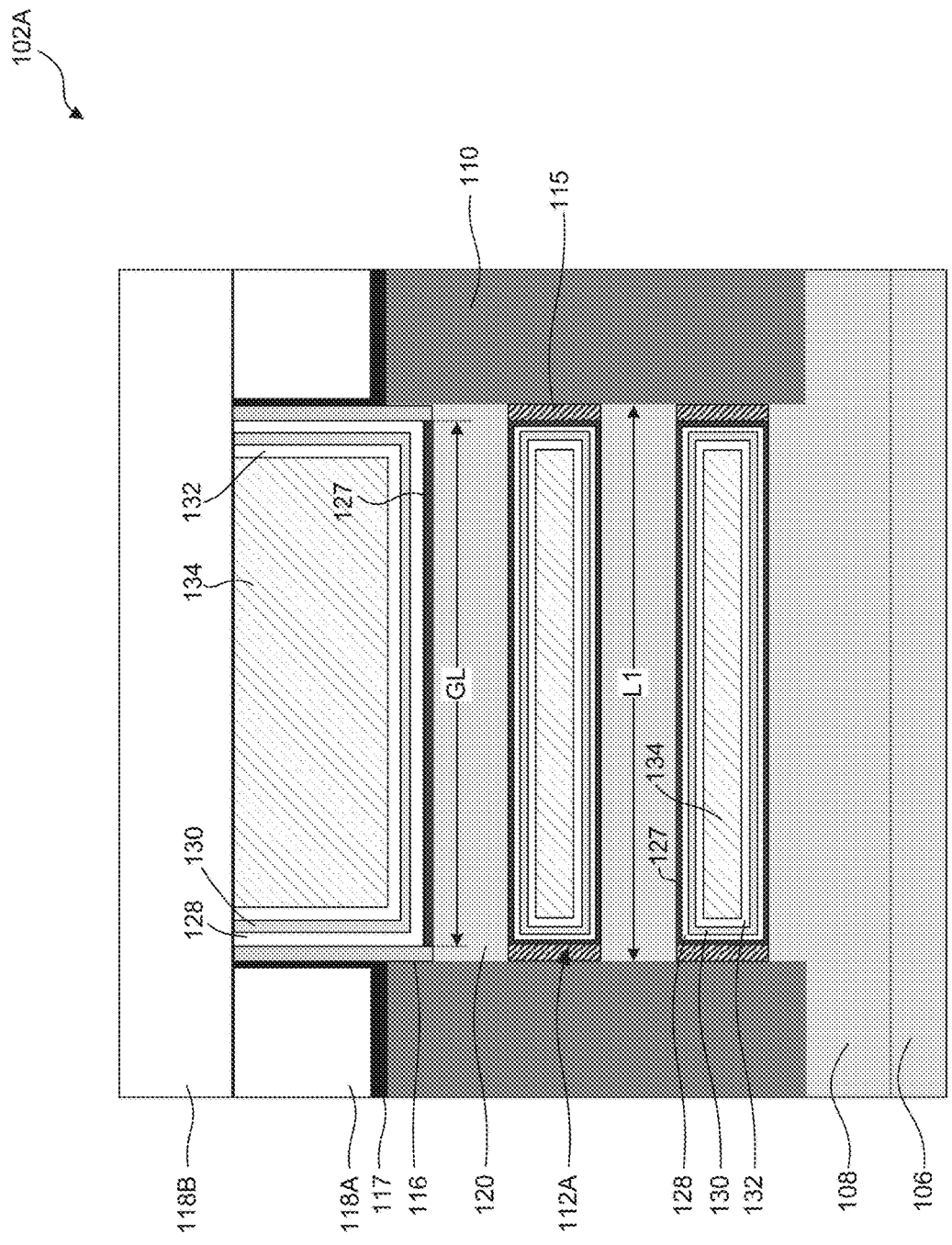
Figure 1F:
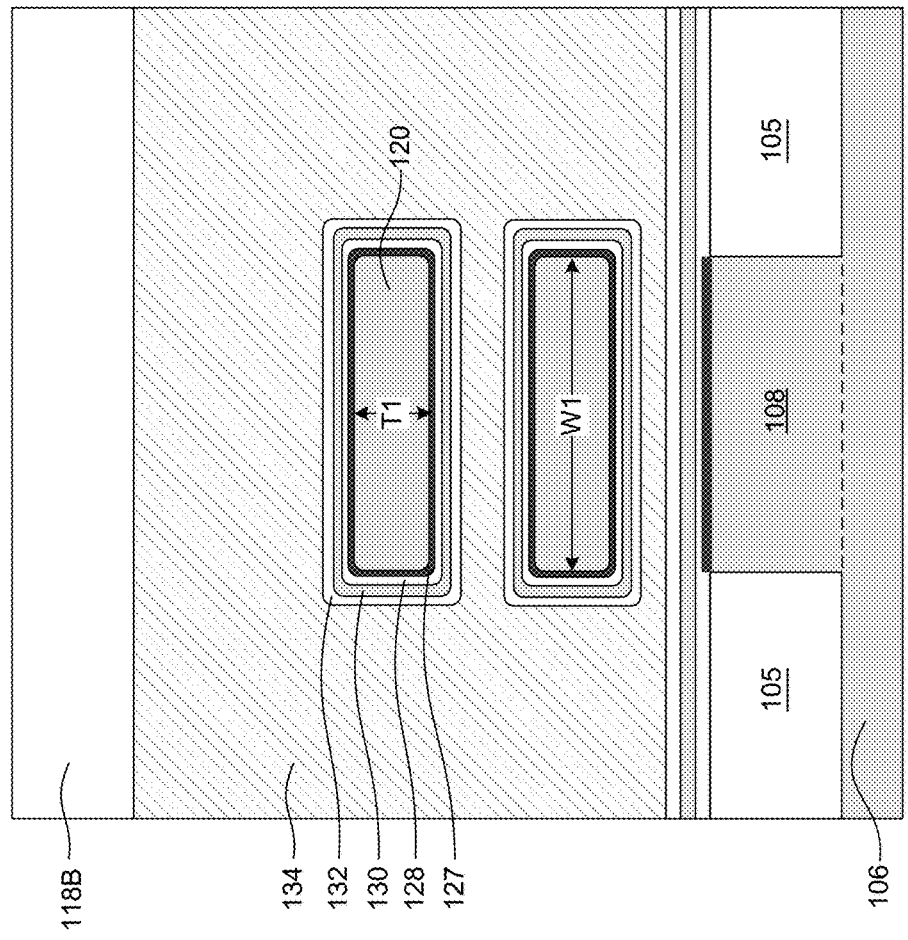
Figure 1F:
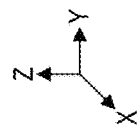

GAA structure 112 can be a multi-layered structure and can surround nanostructured channel regions 120, as shown in FIGS. 1C-1D. GAA structure 112 also surrounds TCG structure 114, as shown in FIGS. 1B-1D. GAA structure 112 can be referred to as "horizontal gate-all-around (HGAA)

structure" and FET 102A can be referred to as "GAA FET 102A." Gate portions 112A of GAA structure 112 underlying nanostructured channel regions 120 can be electrically isolated from adjacent S/D regions 110 by inner spacers 115. Gate portion 112A disposed on the stack of nanostructured channel regions 120 can be electrically isolated from adjacent S/D regions 110 by gate spacers 116. Inner spacers 115 and gate spacers 116 can include an insulating material, such as $SiO_2$, SiN, SiCN, SiOCN, and any other suitable insulating material.

GAA structure 112 can include (i) an interfacial oxide (IO) layer 127, (ii) a high-k (HK) gate dielectric layer 128, (iii) a negative capacitance (NC) gate dielectric layer 130, (iv) a work function metal (WFM) layer 132, and (v) a gate metal fill layer 134. Though FIGS. 1C-1F show that all the layers of GAA structure 112 are wrapped around nanostructured channel regions 120, nanostructured channel regions 120 can be wrapped around by at least IO layer 127 and HK dielectric layer 128 to fill the spaces between adjacent nanostructured channel regions 120. Accordingly, nanostructured channel regions 120 can be electrically isolated from each other to prevent shorting between GAA structure 112 and S/D regions 110 during operation of FET 102A. In some embodiments, GAA structures 112 can have a gate length GL ranging from about 20 nm to about 80 nm, or other suitable dimensions.

IO layers 127 can be disposed on nanostructured channel regions 120. In some embodiments, IO layers 127 can include $SiO_2$, silicon germanium oxide ($SiGeO_x$), germanium oxide ($GeO_x$), or other suitable oxide materials. HK gate dielectric layers 128 can be disposed on IO layers 127 and can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_4$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) other suitable high-k dielectric materials, or (iv) a combination thereof. The term "high-k" refers to a high dielectric constant. In the field of semiconductor device structures and manufacturing processes, high-k refers to a dielectric constant that is greater than the dielectric constant of $SiO_2$ (e.g., greater than 3.9).

NC gate dielectric layer 130 can include dielectric materials that exhibit negative capacitance property. Negative capacitance can be defined as a decrease in voltage across a capacitor with an increase in charge on the capacitor. In some embodiments, NC gate dielectric layer 130 can include (i) a dielectric material with ferroelectric properties, such as hafnium oxide ($HfO_2$), hafnium aluminum oxide (HfAlO), hafnium silicate ($HfSiO_4$), and hafnium zirconium oxide (HfZrO), (ii) a dielectric material in orthorhombic phase (e.g., hafnium oxide ($HfO_2$) in orthorhombic phase), (iii) a dielectric material (e.g., $HfO_2$) doped with one or more metals, such as aluminum (Al), calcium (Ca), cerium (Ce), dysprosium (Dy), erbium (Er), gadolinium (Gd), germanium (Ge), lanthanum (La), scandium (Sc), silicon (Si), strontium (Sr), stannum (Sn), yttrium (Y), and zirconium (Zr), or (iv) a combination thereof. Other suitable NC dielectric materials for NC gate dielectric layer 130 are within the scope of the present disclosure. In some embodiments, NC gate dielectric layer 130 can have a thickness ranging from about 2 nm to about 3 nm or other suitable dimensions. Though some dielectric materials of NC gate dielectric layer 130 includes similar atomic elements as dielectric materials of HK gate dielectric layer 128, NC gate dielectric layer 130 can have different properties than HK gate dielectric layer 128. For example, the NC dielectric material of NC gate dielectric layer 130 can have a resistivity lower than the dielectric material of HK gate dielectric layer 128. In some embodiments, NC gate dielectric layer 130 can be absent from GAA structure 112.

WFM layer 132 can be n- or p-type for n or p-type FET 102A, respectively. In some embodiments, n-type WFM layer 132 can include a metallic material with a work function value closer to a conduction band energy than a valence band energy of a material of nanostructured channel regions 120. For example, n-type WFM layer 132 can include an Al-based or Al-doped metallic material with a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based nanostructured channel regions 120. In some embodiments, n-type WFM layer 132 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof.

In some embodiments, p-type WFM layer 132 can include a metallic material with a work function value closer to a valence band-edge energy than a conduction band-edge energy of a material of nanostructured channel regions 120. For example, p-type WFM layer 132 can include a substantially Al-free (e.g., with no Al) metallic material with a work function value equal to or greater than 4.5 eV (e.g., about 4.5 eV to about 5.5 eV), which can be closer to the valence band-edge energy (e.g., 5.2 eV of Si or 4.8 eV of SiGe) than the conduction band-edge energy (e.g., 4.1 eV of Si or 3.8 eV of SiGe) of Si-based or SiGe-based nanostructured channel regions 120. In some embodiments, p-type WFM layer 132 can include substantially Al-free (e.g., with no Al): (i) Ti-based nitrides or alloys, such as TiN, TiSiN, titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, and titanium nickel (Ti—Ni) alloy; (ii) Ta-based nitrides or alloys, such as TaN, TaSiN, Ta—Au alloy, Ta—Cu alloy, Ta—W alloy, tantalum platinum (Ta—Pt) alloy, Ta—Mo alloy, Ta—Ti alloy, and Ta—Ni alloy; (iii) metal nitrides, such as molybdenum nitride (MoN) and tungsten nitride (WN); (iv) other suitable Al-free metallic materials; (v) and combinations thereof.

In some embodiments, WFM layer 132 can include a thickness ranging from about 1 nm to about 4 nm. The thickness within this range can allow WFM layer 132 to be wrapped around nanostructured channel regions 120 without being constrained by the spacing between adjacent nanostructured channel regions 120.

In some embodiments, gate metal fill layer 134 can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), any other suitable conductive material, and a combination thereof. In some embodiments, gate metal fill layer 134 can include a substantially fluorine-free metal layer (e.g., fluorine-free W). The substantially fluorine-free metal layer can include an amount of fluorine contaminants less than about 5 atomic percent in the form of ions, atoms, and/or molecules.

Referring to FIGS. 1B-1D, through-channel gate (TCG) structure 114 can extend along a Z-axis through nanostructured channel regions 120 and GAA structure 112 and can be disposed on the portion of fin structure 108 underlying nanostructure channel regions 120. Portions of TCG structure 114 can be alternatively surrounded by nanostructured channel regions 120 and GAA structure 112 about a Z-axis. In some embodiments, TCG structure 114 can have a circular cross-section along an X-Y plane, as shown in FIG. 1B. In some embodiments, TCG structure 114 can have a cross-section of other geometric shapes (e.g., rectangular, elliptical, or polygonal; not shown) along an X-Y plane. In some embodiments, TCG structure 114 can have a diameter D1 (or a width along an X-axis and/or Y-axis) ranging from about 8 nm to about 12 nm. In some embodiments, a ratio between diameter D1 and length L1 (i.e., D1:L1) and between diameter D1 and width W1 (i.e., D1:W1) can range from about 1:2 to about 1:10. In some embodiments, a ratio between diameter D1 and gate length GL (i.e., D1:GL) can range from about 1:2 to about 1:10. These dimensions and/or relative dimensions of TCG structure 114 provide adequate volume for the formation of gate dielectric and metal layers of TCG structure 114 to provide adequate threshold voltage for FET 102A. Below these dimensions and/or relative dimensions of TCG structure 114, the gate dielectric and/or metal layers of TCG structure 114 may not be adequately formed, and consequently, degrade the device performance. Above these dimensions and/or relative dimensions of TCG structure 114, the cost of manufacturing FET 102A with TCG structure 114 is increased. Top surface 114t of TCG structure 114 can be substantially coplanar with top surface 112t of GAA structure 112. Bottom surface 114b of TCG structure 114 can be in physical contact with top surface 108t of fin structure 108.

In some embodiments, TCG structure can include (i) a HK gate dielectric layer 138, (iii) a NC gate dielectric layer 140 disposed on HK gate dielectric layer 138, (iv) a WFM layer 142 disposed on NC gate dielectric layer 140, and (v) a gate metal fill layer 144 disposed on NC gate dielectric layer 140. In some embodiments, HK gate dielectric layer 138, NC gate dielectric layer 140, WFM layer 142, and gate metal fill layer 144 are arranged concentrically with respect to each other, as shown in FIG. 1B. In some embodiments, HK gate dielectric layer 138 can be absent from TCG structure 114. In some embodiments, WFM layer 142 can be absent and gate metal fill layer 144 can be disposed on NC gate dielectric layer 140. In some embodiments, gate metal fill layer 144 can be absent and WFM metal layer 142 can function as both WFM layer and gate metal fill layer for TCG structure 114. NC gate dielectric layer 140 can prevent or reduce parasitic capacitance between portions of TCG structure 114 in contact with GAA structure 112.

The discussion of materials for HK gate dielectric layer 128, NC gate dielectric layer 130, WFM layer 132, and gate metal fill layer 134 applies to respective HK gate dielectric layer 138, NC gate dielectric layer 140, WFM layer 142, and gate metal fill layer 144, unless mentioned otherwise. In some embodiments, HK gate dielectric layer 138, NC gate dielectric layer 140, WFM layer 142, and gate metal fill layer 144 can have materials similar to or different from HK gate dielectric layer 128, NC gate dielectric layer 130, WFM layer 132, and gate metal fill layer 134, respectively.

Figure 1G:
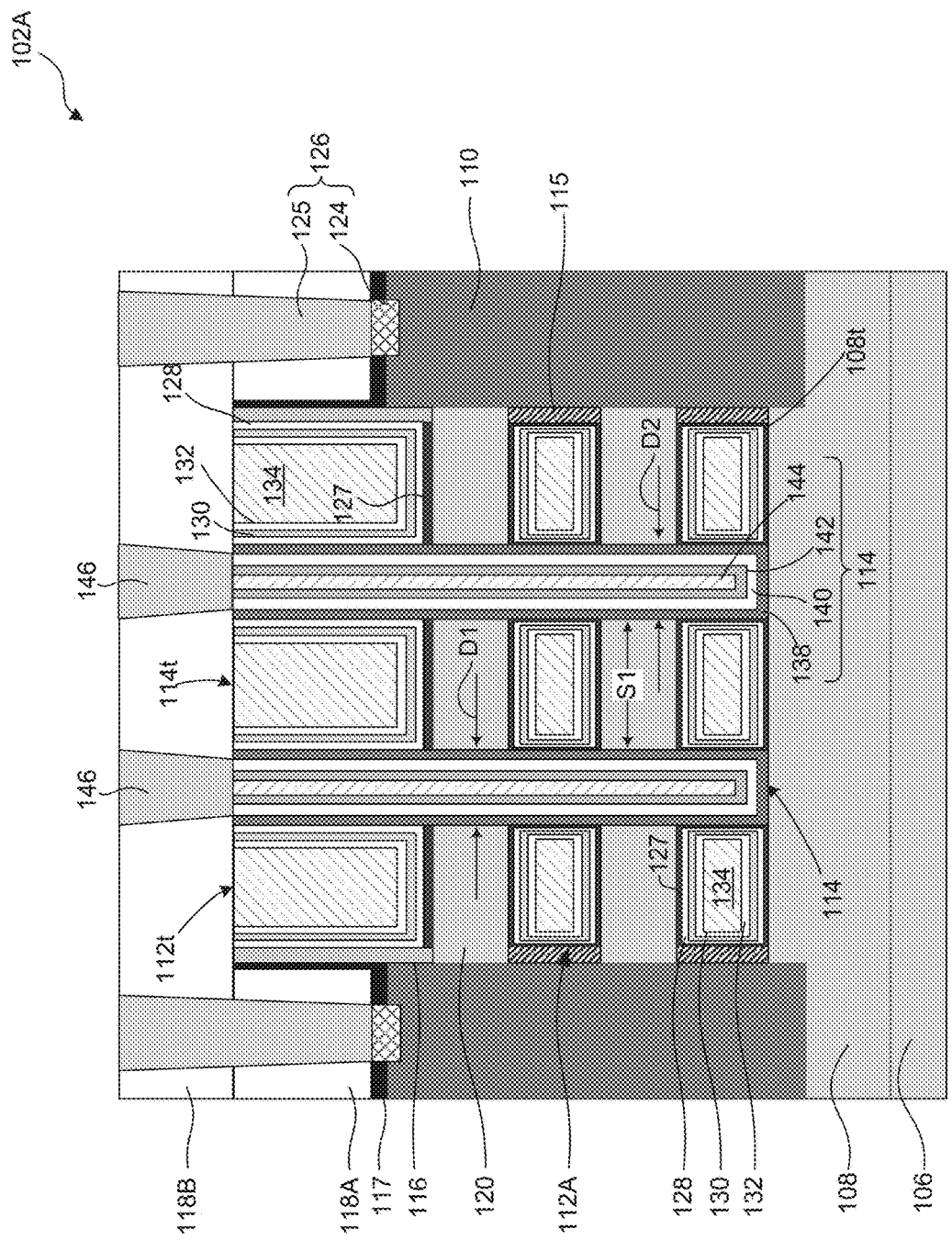
FIGS. 1G-1H illustrate cross-sectional views of a semiconductor device with different gate structures, in accordance with some embodiments.
Figure 1H:
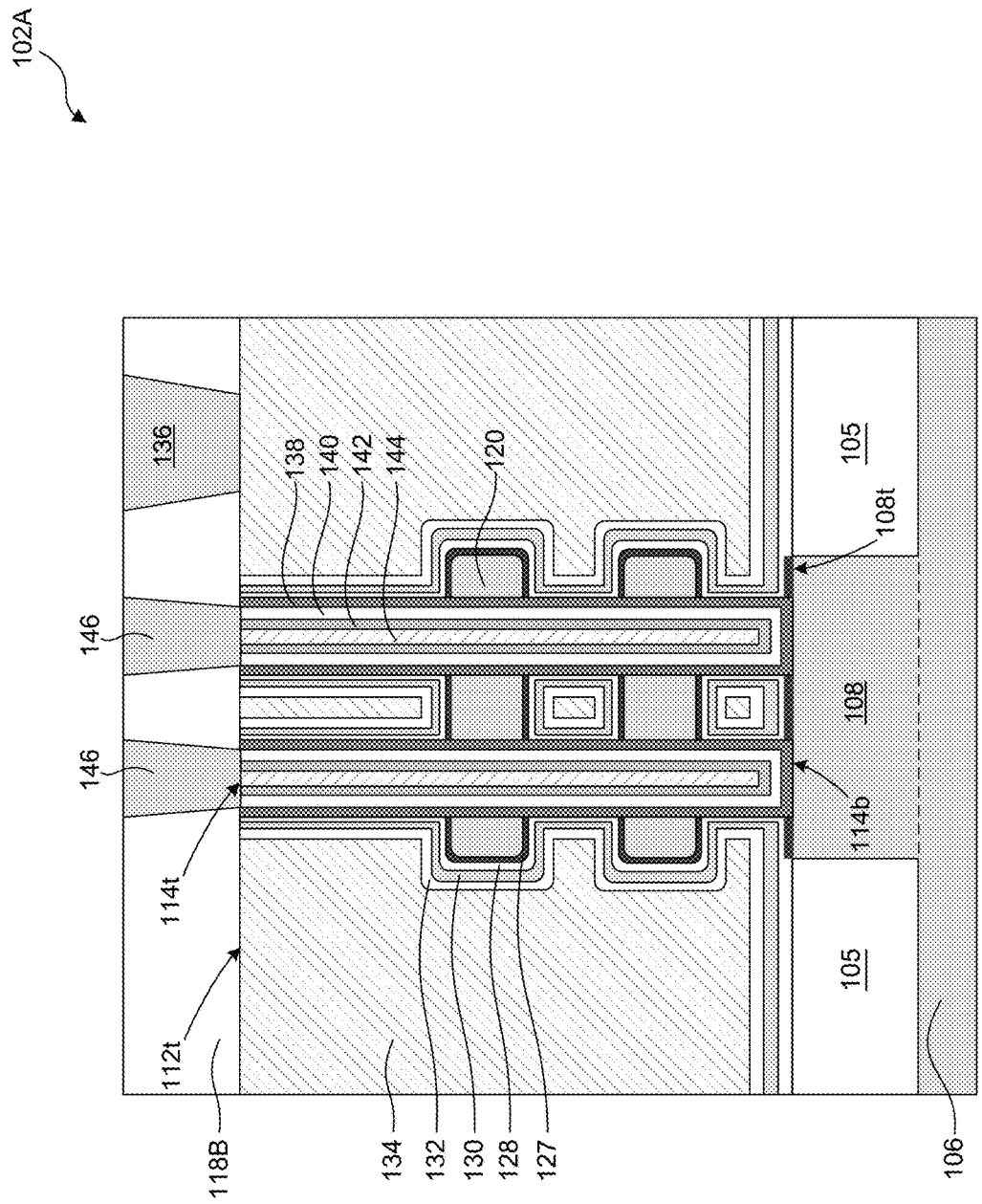
Figure 11:
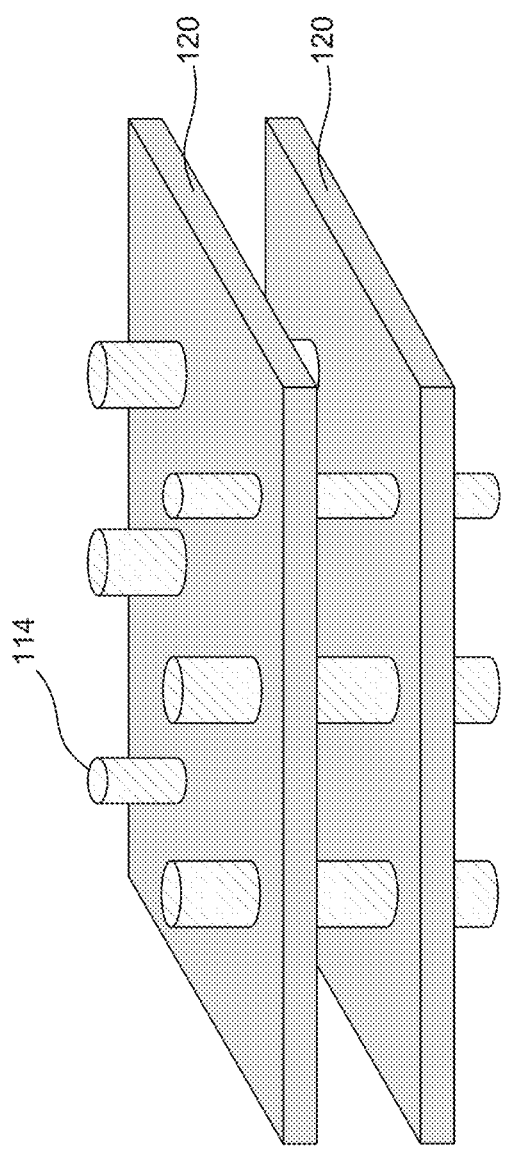
FIGS. 3A-19B illustrate cross-sectional views of a semiconductor device with different gate structure at various stages of its fabrication process, in accordance with some embodiments.

In some embodiments, instead of a single TCG structure 114, FET 102A can have a pair of TCG structures 114, as shown in FIGS. 1G-1H. FIGS. 1G-1H illustrate cross-sectional views of FET 102A, along lines C-C and D-D of FIG. 1A, with a pair of TCG structures 114 and additional elements that are not shown in FIG. 1A for simplicity. The discussion of elements in FIGS. 1A-1H with the same annotations applies to each other, unless mentioned otherwise. Both TCG structures 114 can extend along a Z-axis through nanostructured channel regions 120 and GAA structure 112 and can be disposed on the portion of fin structure 108 underlying nanostructure channel regions 120. Both TCG structures 114 can be surrounded by nanostructured channel regions 120 and GAA structure 112 along a Y-axis. TCG structures 114 can be separated from each other by portions of nanostructured channel regions 120 and GAA structure 112 interposed between TCG structures 114. In some embodiments, TCG structures 114 can be spaced apart from each other by a distance Si ranging from about 1 nm to about 20 nm. In some embodiments, TCG structures 114 can have diameters D1-D2 (or widths along an X-axis and/or Y-axis) ranging from about 8 nm to about 12 nm. Diameters D1-D2 can be equal to or different from each other. In some embodiments, for HK gate dielectric layer 138, NC gate dielectric layer 140, WFM layer 142, and gate metal fill layer 144, each TCG structure 114 can have similar or different materials with respect to each other.

Though FET 102A is illustrated with one and two TCG structures 114, FET 102A can have any number of TCG structures, such as TCG structure 114, arranged in a 1-dimensional or a 2-dimensional array. For example, FET 102A can have a 2-dimensional array of TCG structures 114, as shown in FIG. 1I. FIG. 1I illustrates an isometric view of TCG structures 114 extending through the stack of nanostructured channel regions 120. Other elements of FET 102A are not shown in FIG. 1I for simplicity. Each of TCG structures 114 in the 2-dimensional array can be similar to each other or can differ from each other in material composition and/or in dimensions along an X-axis and/or a Y-axis.

The combination of gate structures— GAA structure 112 and one or more TCG structures 114—can provide a single FET, such as FET 102A with a multi-Vt device functionality. By controlling the voltages applied to GAA structure 112 and one or more TCG structures 114, the threshold voltage of FET 102A can be modulated to achieve different threshold voltages of FET 102A. With the use of one or more TCG structures 114, the threshold voltage of FET 102A can be tuned to higher voltages during a standby mode of FET 102A to reduce the leakage current, thus reducing power consumption and improving device performance. Voltages to GAA structure 112 and TCG structures 114 can be supplied through respective contact structures 136 and 146, as shown in FIGS. 1C-1D and 1G-1H. Top views of GAA structure 112 and TCG structure 114 in FIG. 1B are illustrated without contact structures 136 and 146 for simplicity. Contact structures 136 and 146 can include conductive materials, such as Co, W, Ru, Ir, Ni, Os, Rh, Al, Mo, Cu, Zr, Sn, Ag, Au, Zn, Cd, any other suitable conductive material, and a combination thereof.

Figure 2:
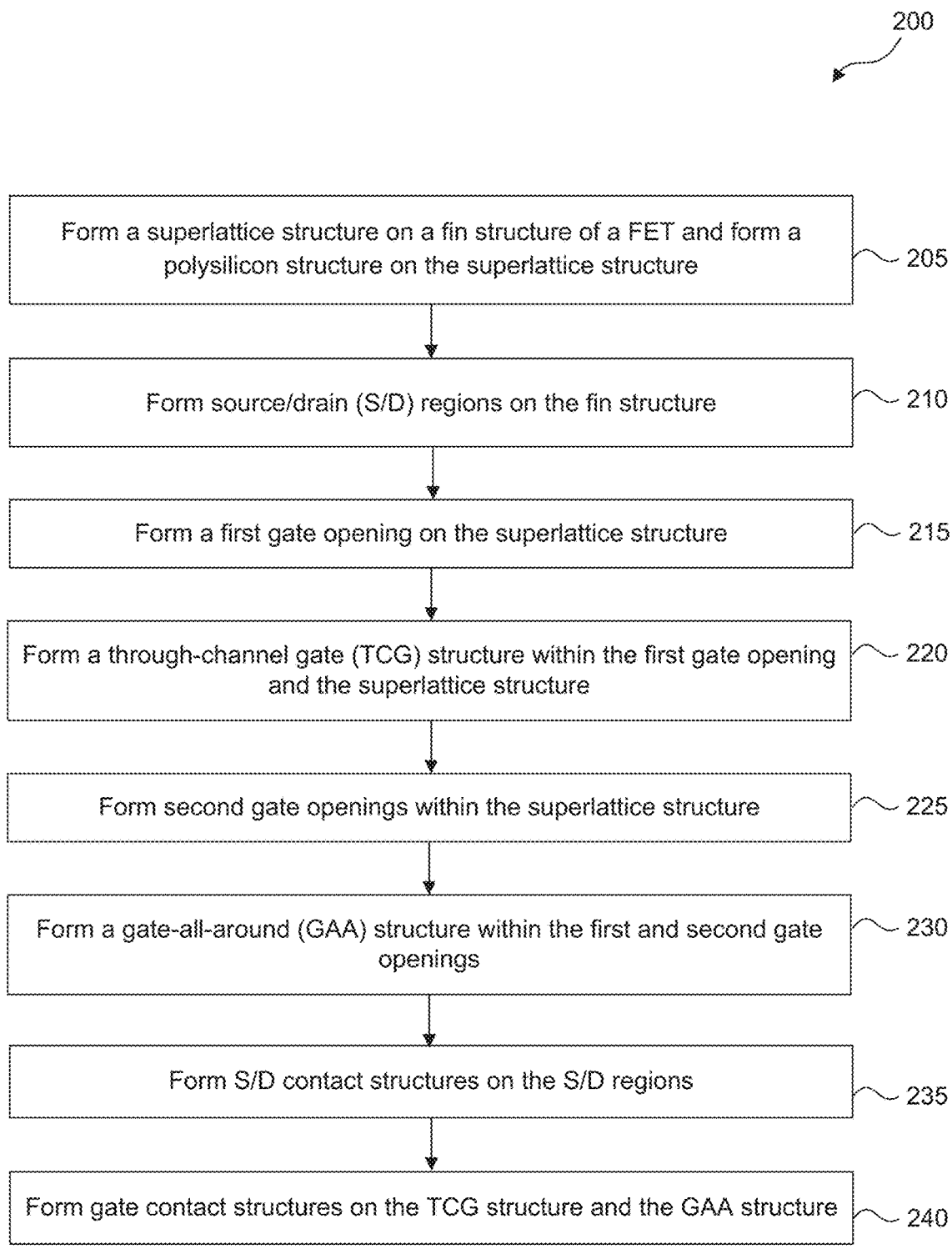
FIG. 2 is a flow diagram of a method for fabricating a semiconductor device with different gate structure configurations, in accordance with some embodiments.

FIG. 2 is a flow diagram of an example method 200 for fabricating FET 102A of semiconductor device 100, according to some embodiments. For illustrative purposes, the operations illustrated in FIG. 2 will be described with reference to the example fabrication process for fabricating FET 102A as illustrated in FIGS. 3A-19B. FIGS. 3A-19B are cross-sectional views of FET 102A along lines C-C and D-D of semiconductor device 100 at various stages of fabrication, according to some embodiments. Operations can be performed in a different order or not performed depending on specific applications. It should be noted that method 200 may not produce a complete FET 102A. Accordingly, it is understood that additional processes can be provided before, during, and after method 200, and that some other processes may only be briefly described herein. Elements in FIGS. 3A-19B with the same annotations as elements in FIGS. 1A-1F are described above.

Figure 3A:
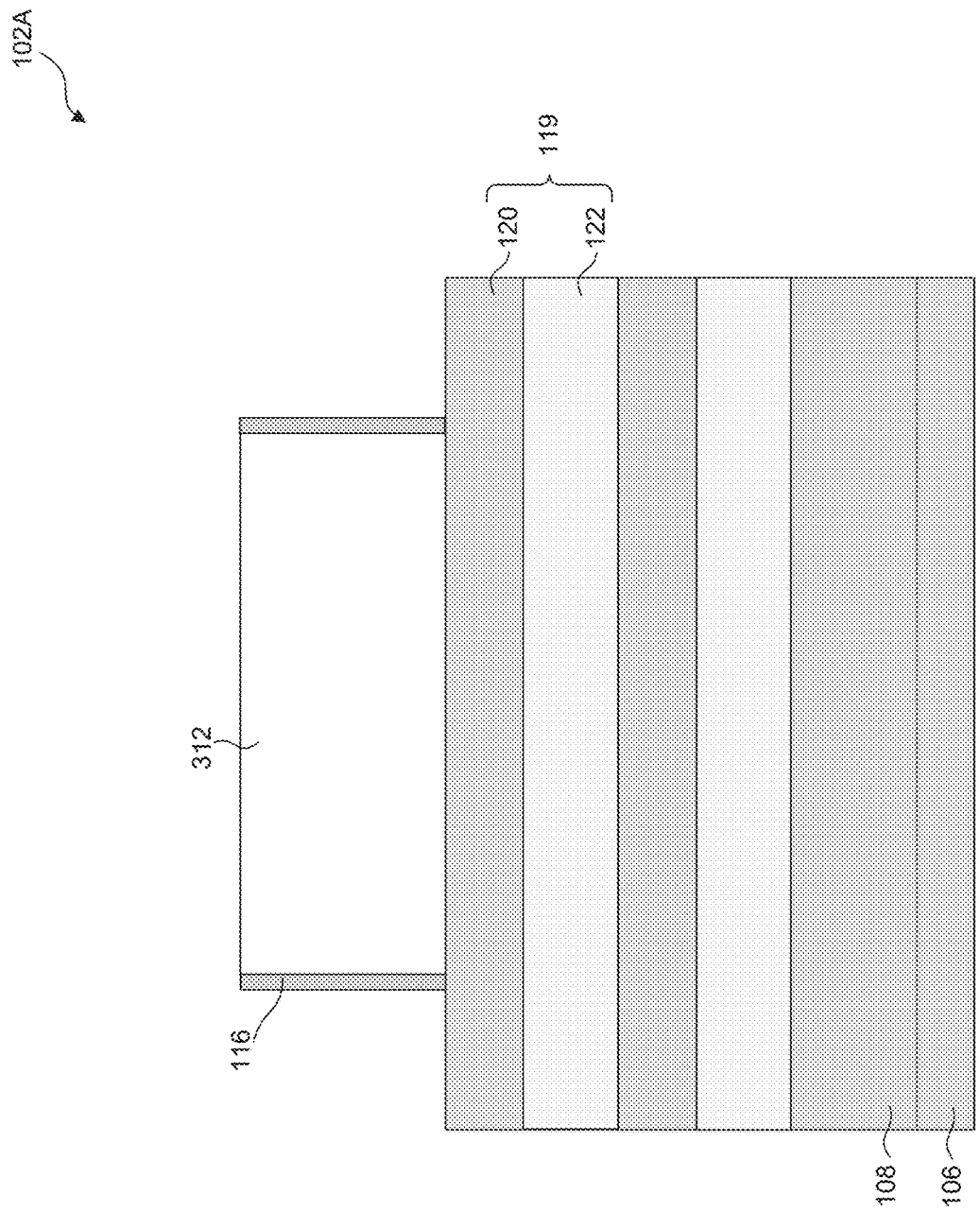
Figure 3B:
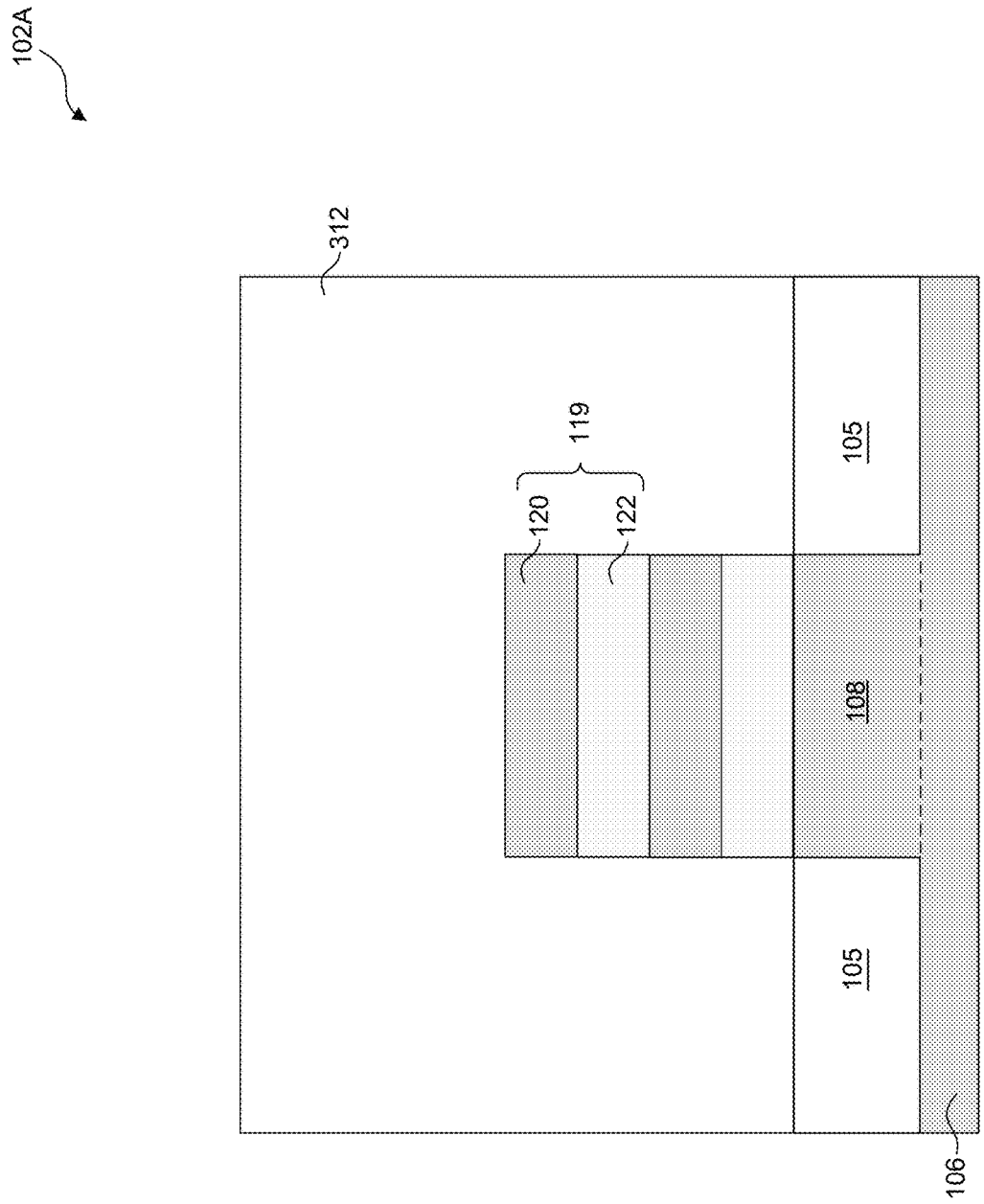

In operation 205, a superlattice structure is formed on a fin structure of a FET, and a polysilicon structure is formed on the superlattice structure. For example, as shown in FIGS. 3A-3B, a polysilicon structure 312 is formed on a superlattice structure 119, which is epitaxially formed on fin structure 108. Superlattice structure 119 can include nanostructured layers 120-122 arranged in an alternating configuration. In some embodiments, nanostructured layers 120 can include Si without any substantial amount of Ge (e.g., with no Ge) and nanostructured layers 122 can include SiGe. During subsequent processing, polysilicon structure 312 and nanostructured layers 122 can be replaced in a gate replacement process to form GAA structure 112.

Figure 4A:
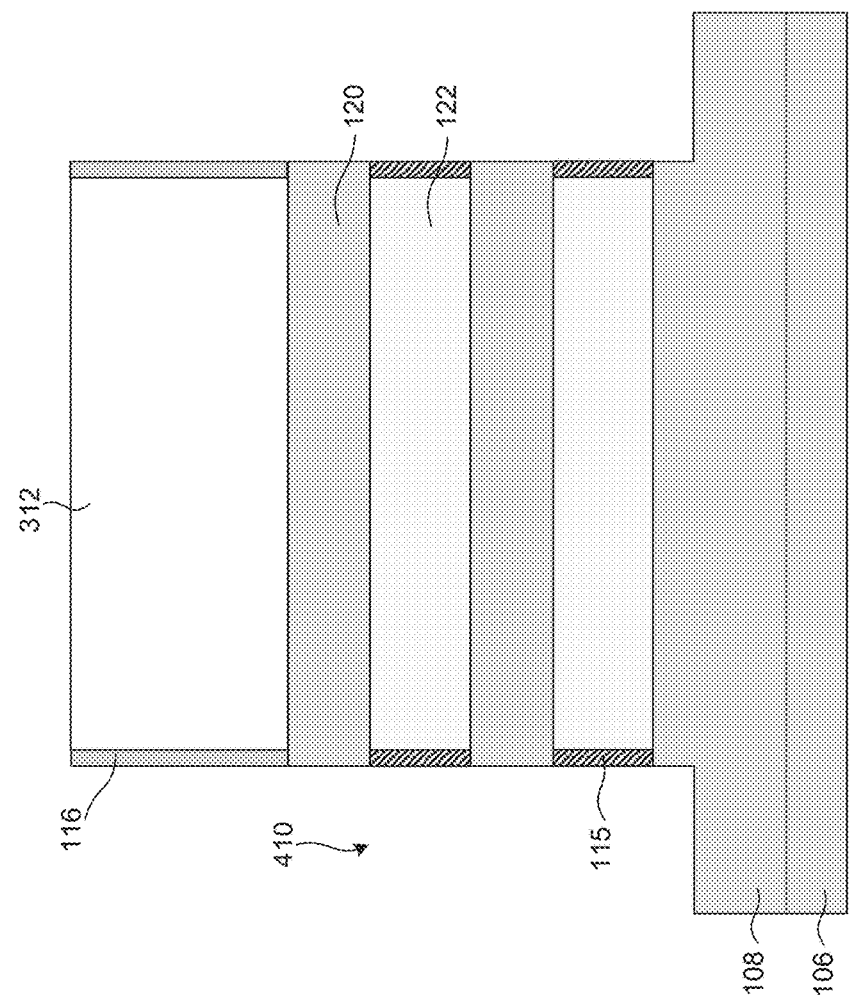
Figure 4A:
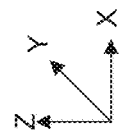
Figure 4B:
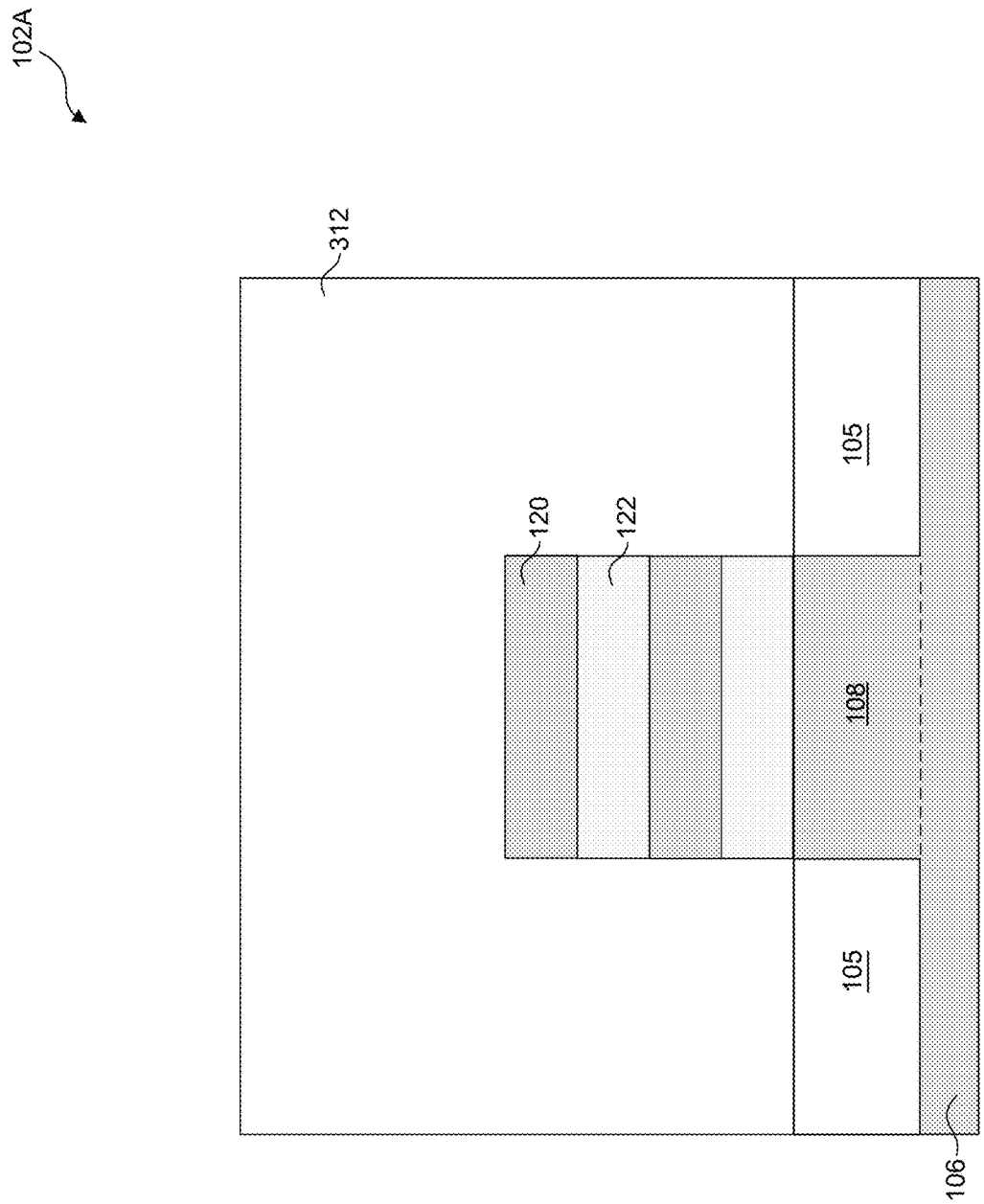
Figure 5A:
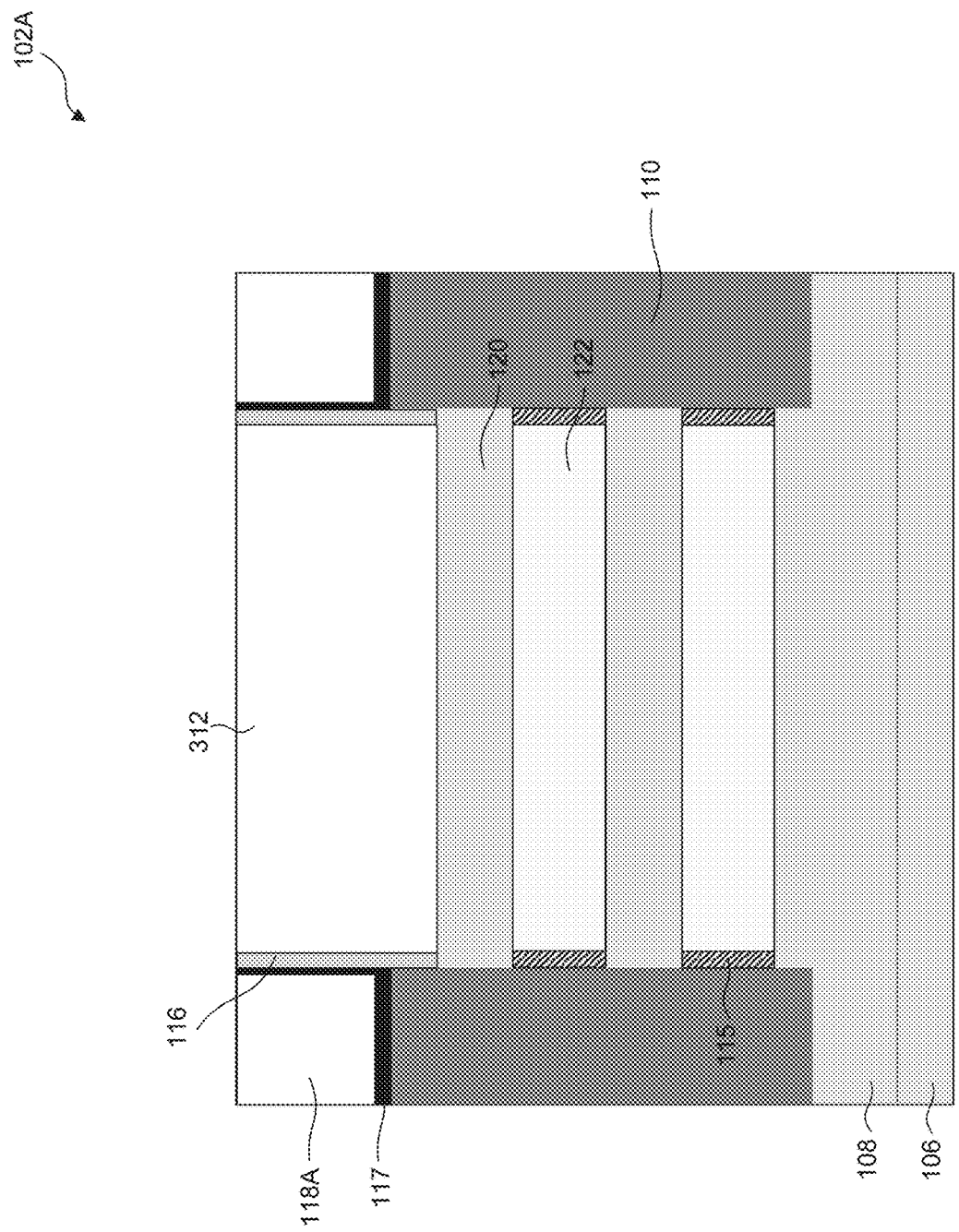
Figure 5B:
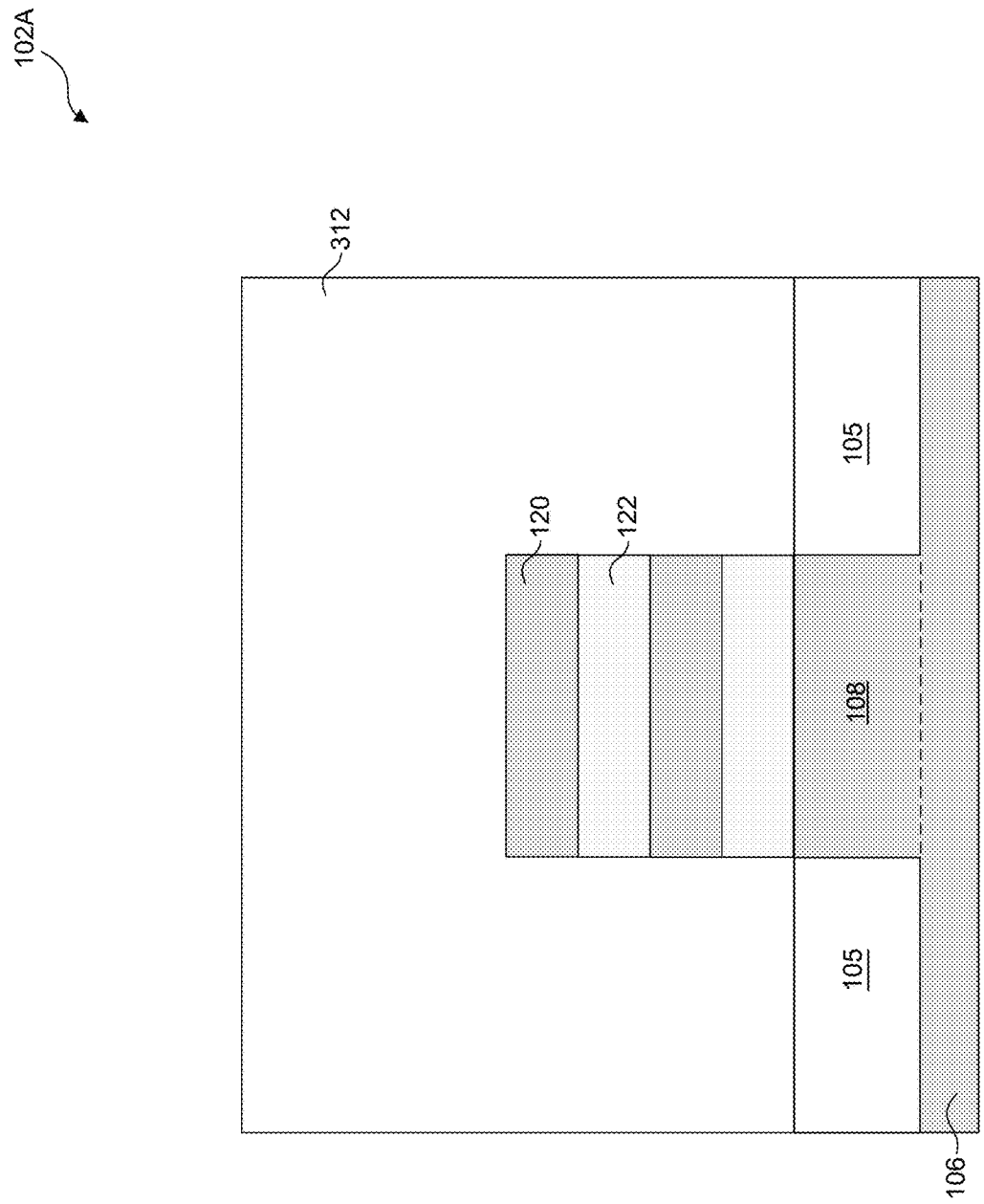

Referring to FIG. 2, in operation 210, S/D regions are formed on the fin structure. For example, as described with reference to FIGS. 4A-5B, S/D regions 110 are formed on fin structure 108. The formation of S/D regions 110 can include sequential operations of (i) forming S/D openings 410, through superlattice structure 119, on portions of fin structure 108 that are not underlying polysilicon structure 312, as shown in FIG. 4A, and (ii) epitaxially growing n-type or p-type semiconductor materials within S/D openings 410, as shown in FIG. 5A. In some embodiments, inner spacers 115 can be formed between operations (i) and (ii) of the formation process of epitaxial S/D regions 110, as shown in FIG. 5A. Inner spacers 115 can be formed after the formation of S/D openings 410, as shown in FIG. 4A. After the formation of S/D regions 110, ESL 117 and ILD layer 118A can be formed on S/D regions 110 to form the structure of FIG. 5A.

Figure 6A:
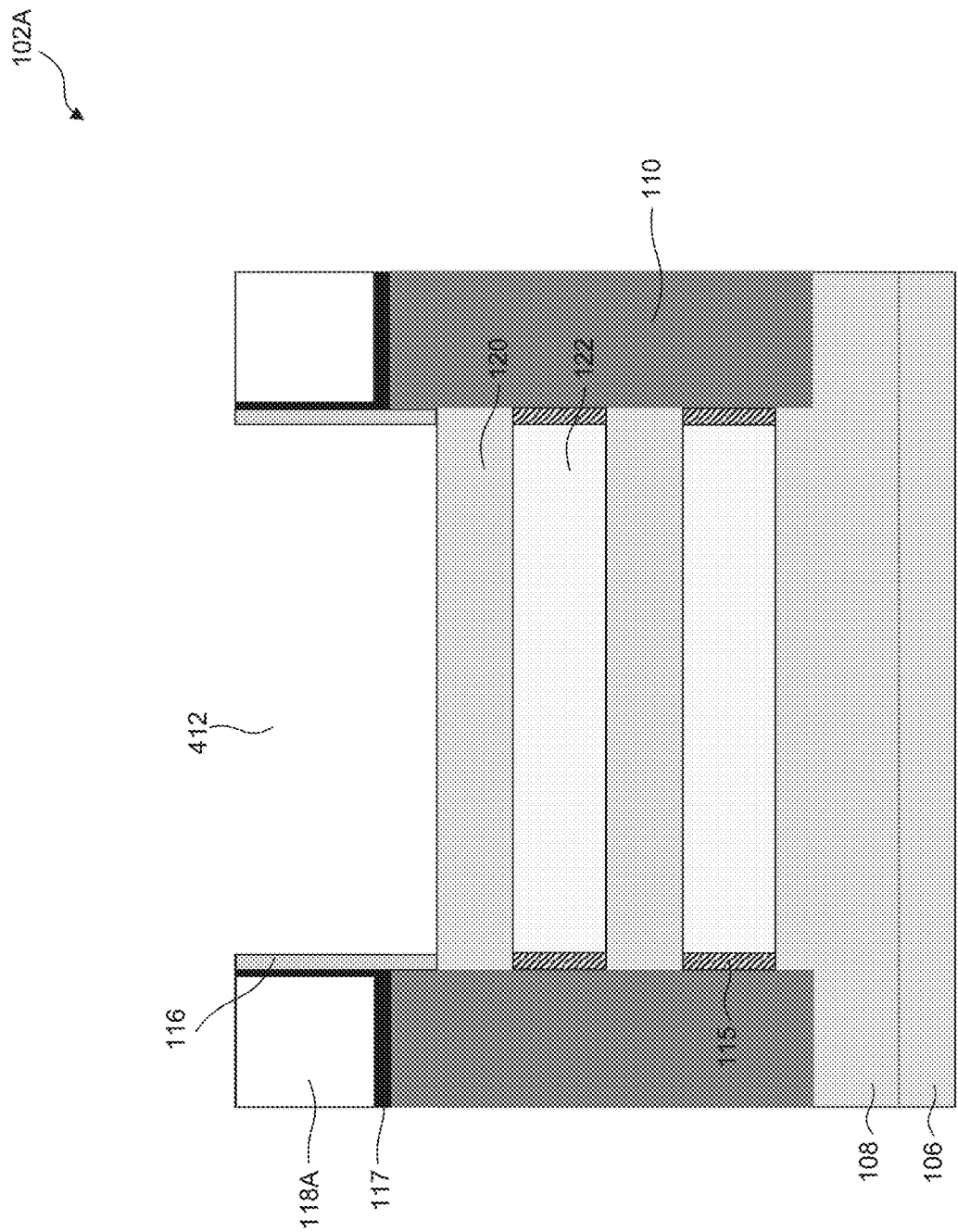
Figure 6B:
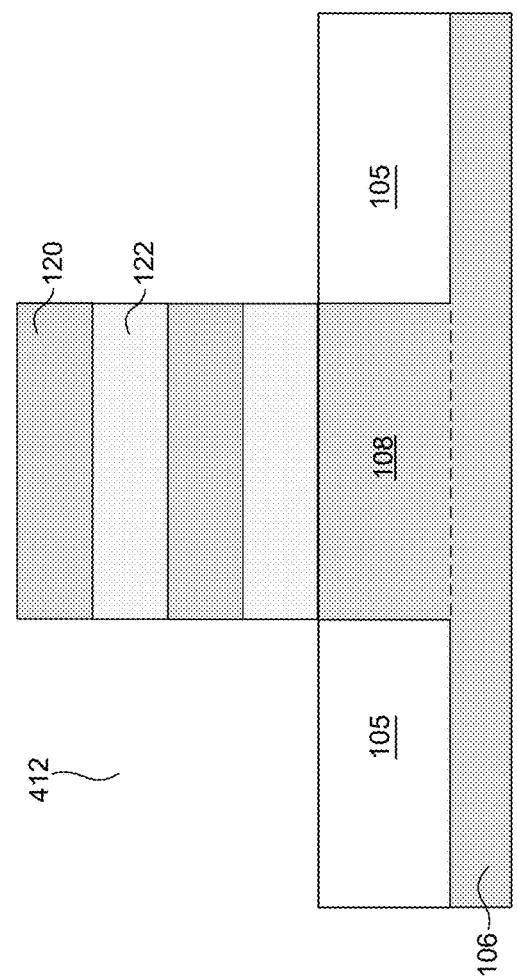

Referring to FIG. 2, in operation 215, a first gate opening is formed on the superlattice structure. For example, as shown in FIGS. 6A-6B, a first gate opening 412 is formed on superlattice structure 119. The formation of first gate opening 412 can include etching polysilicon structure 312 from the structures of FIGS. 5A-5B to form the structures of FIGS. 6A-6B.

Figure 7A:
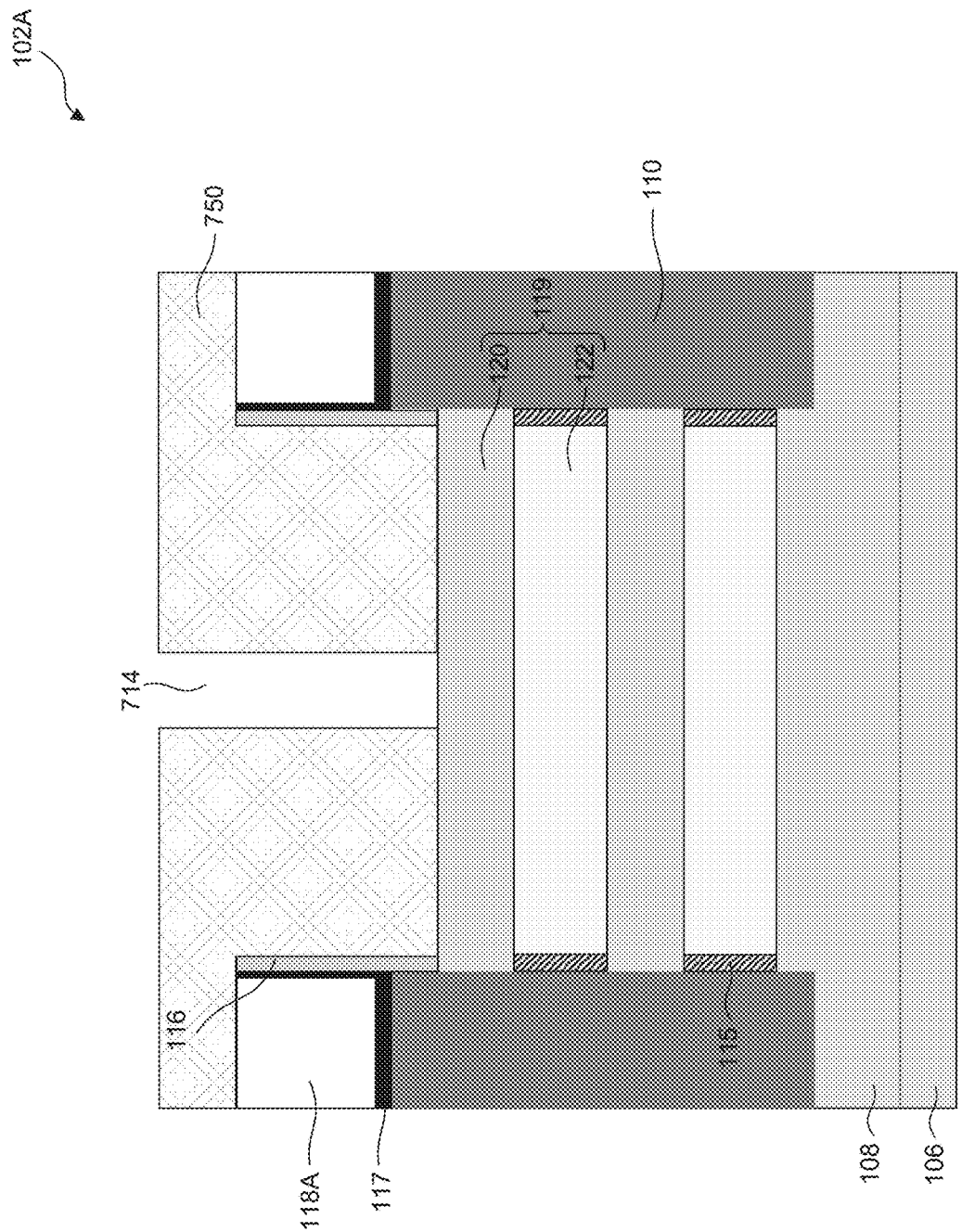
Figure 7B:
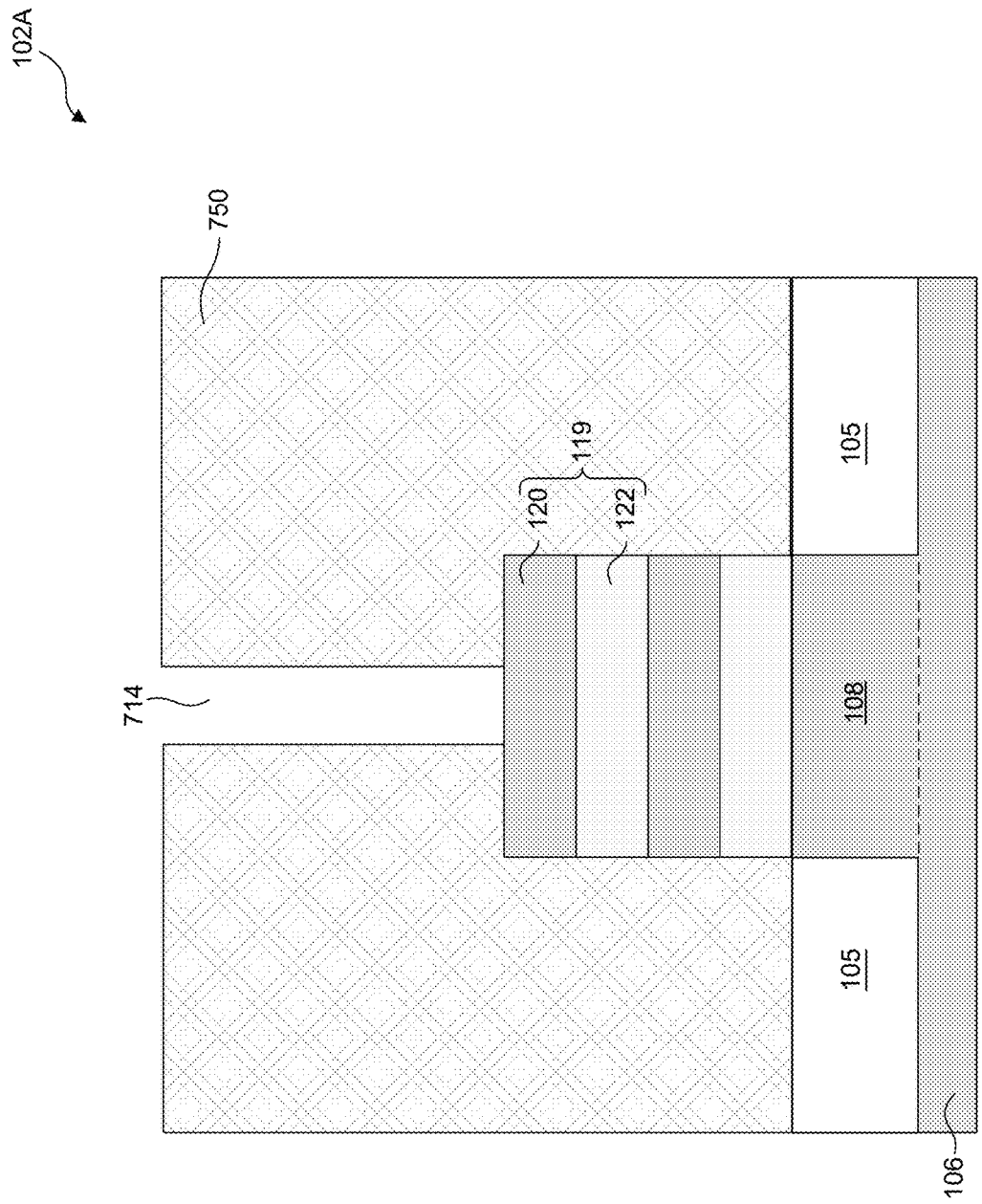
Figure 8A:
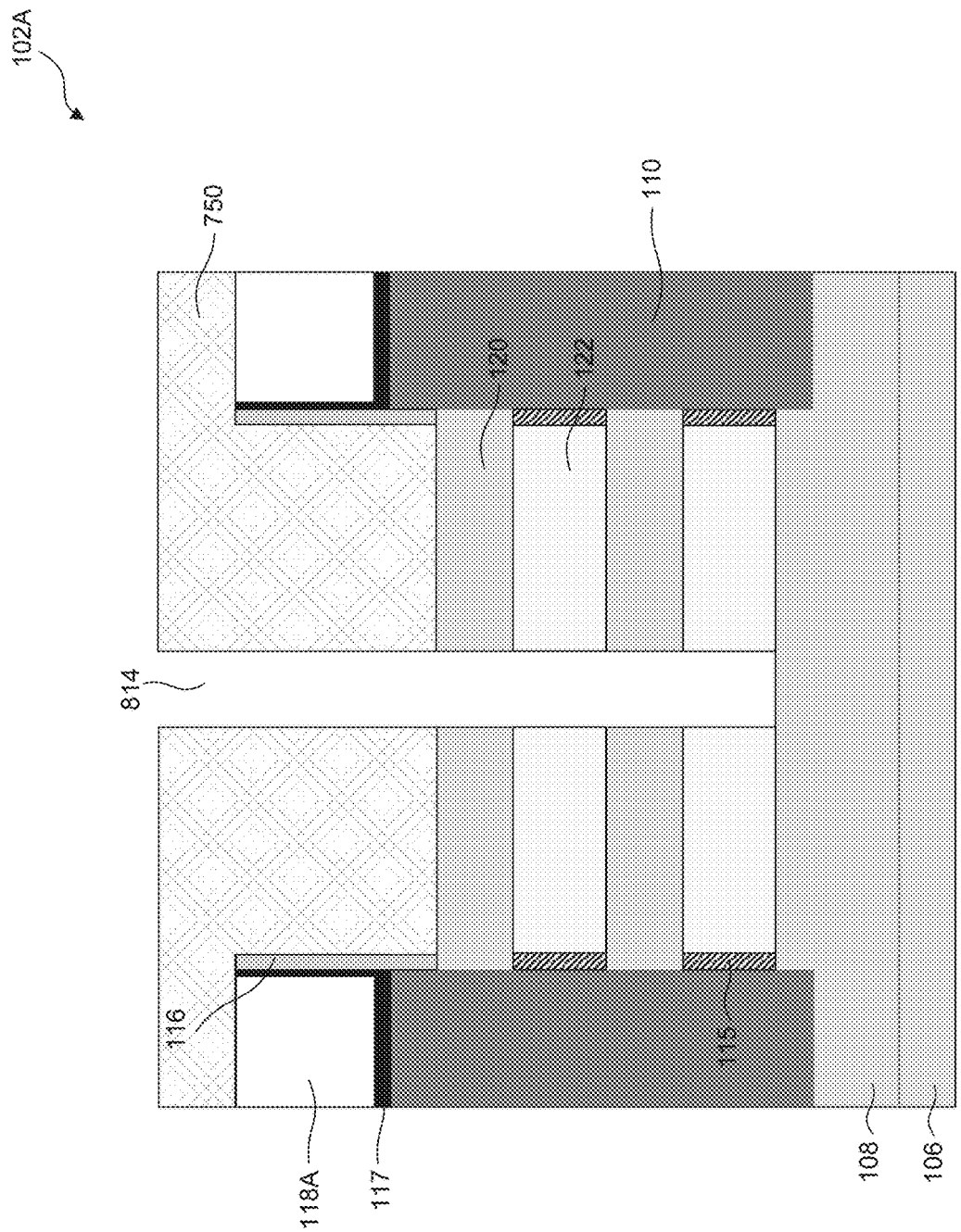
Figure 8B:
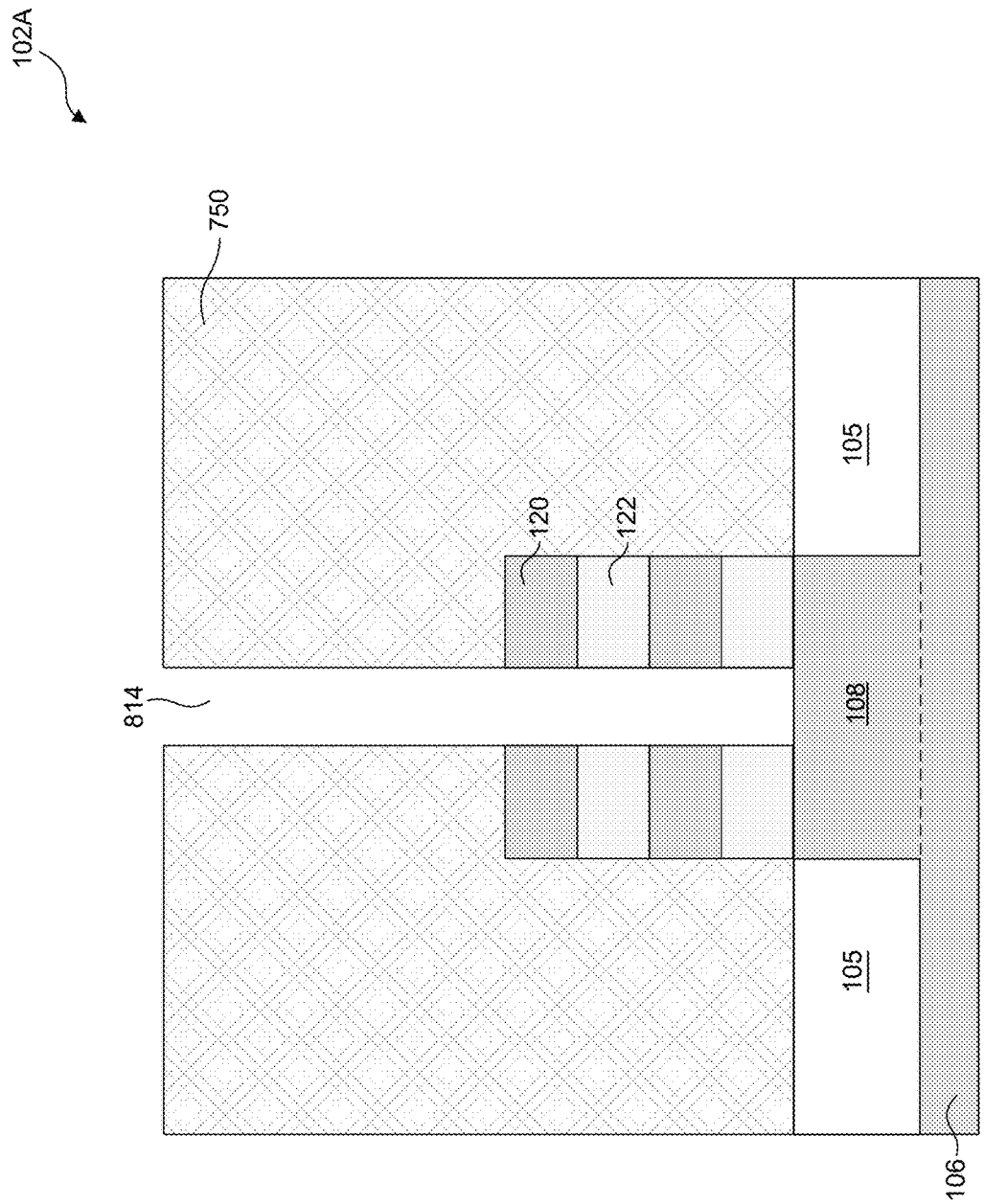
Figure 9A:
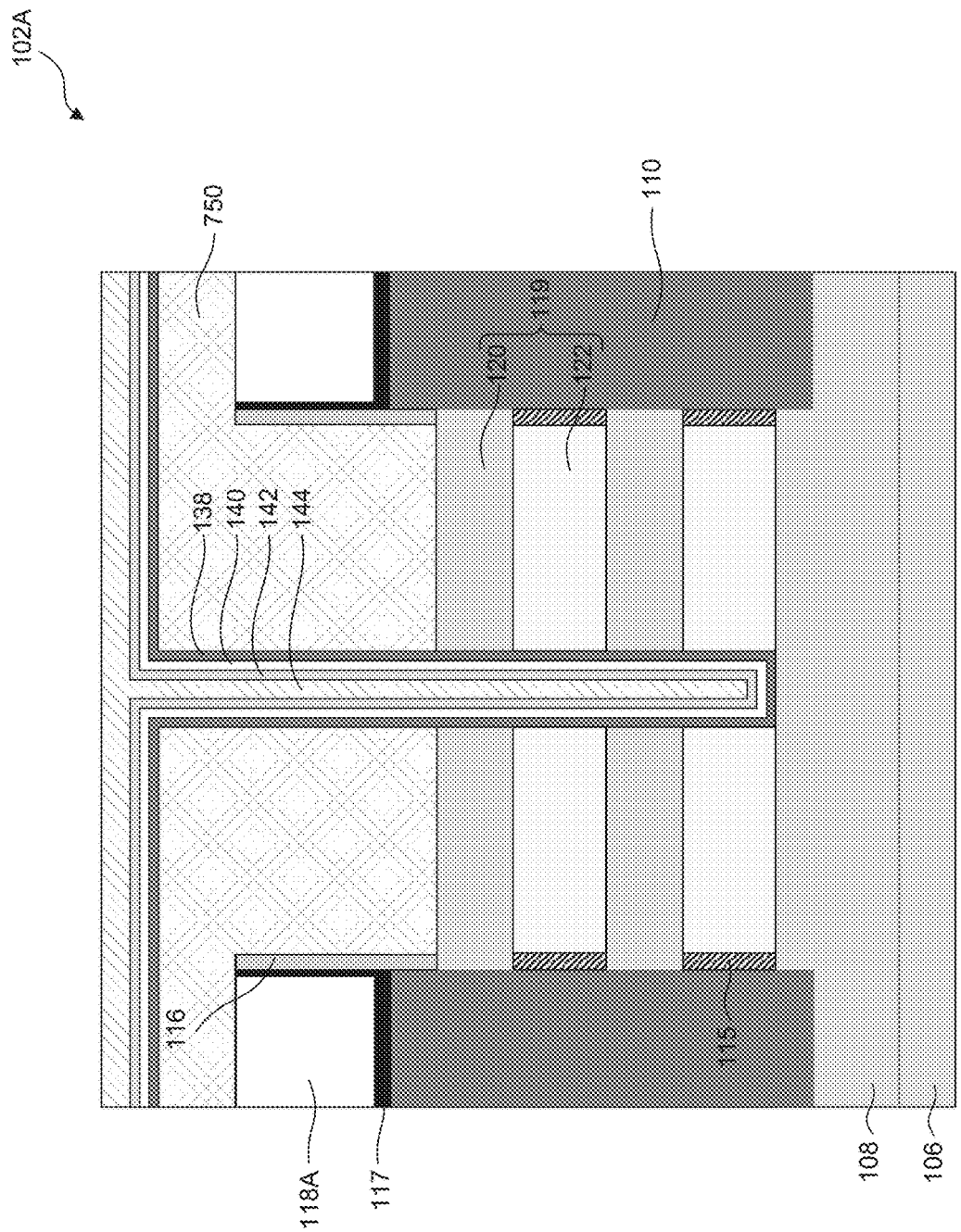
Figure 9B:
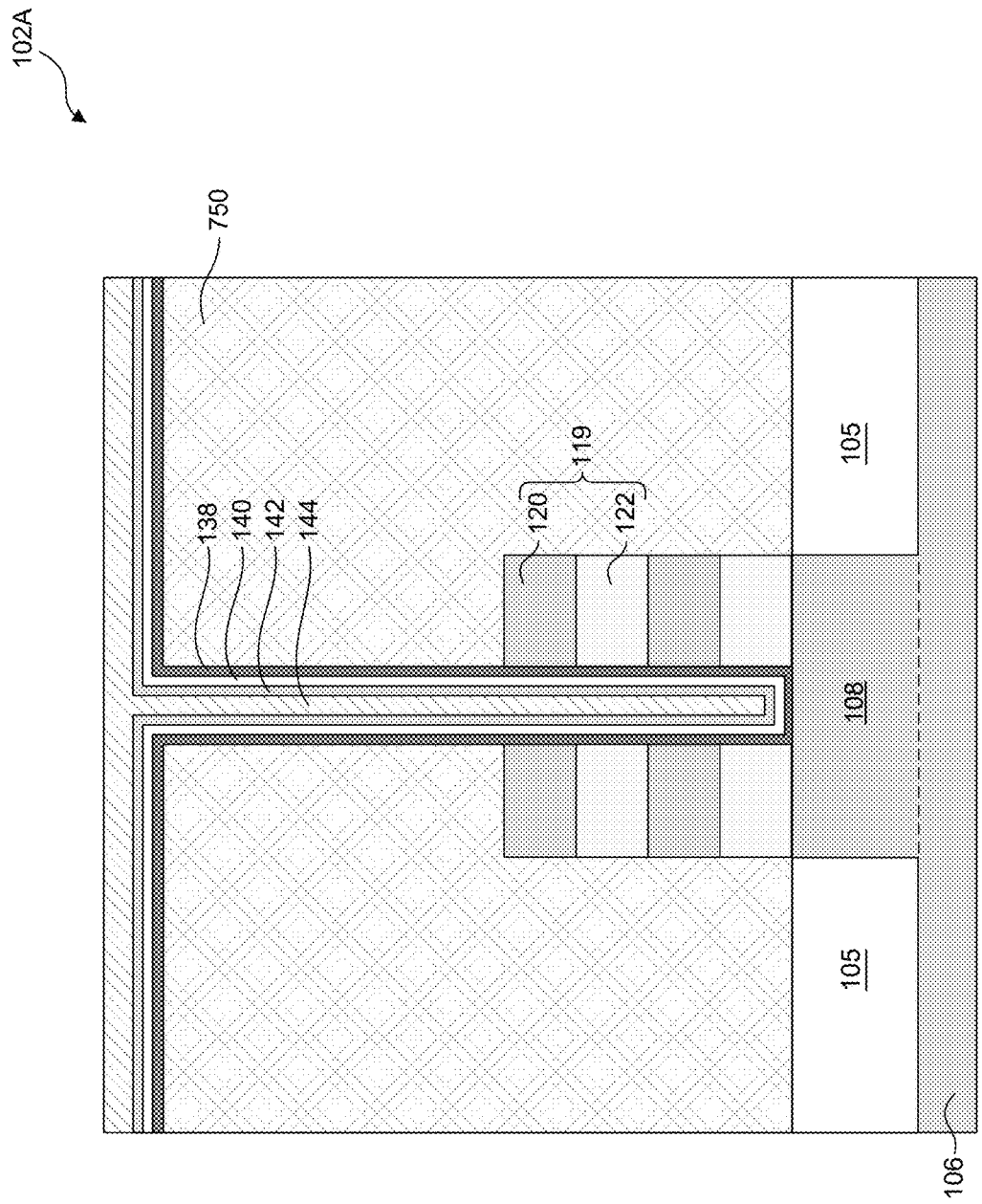

Referring to FIG. 2, in operation 220, a through-channel gate (TCG) structure is formed within the first gate opening and the superlattice structure. For example, as described with reference to FIGS. 7A-11B, TCG structure 114 is formed within first gate opening 412 and superlattice structure 119. The formation of TCG structure 114 can include sequential operations of (i) forming a patterned masking layer 750 (e.g., a photoresist layer or a nitride layer) with an openings 714 on the structures of FIGS. 6A-6B, as shown in FIGS. 7A-7B, (ii) etching nanostructured layers 120-122 through opening 714 to form a gate opening 814 through superlattice structure 119 and on fin structure 108, as shown in FIGS. 8A-8B, (iii) depositing HK gate dielectric layer 138 within gate opening 814, as shown in FIGS. 9A-9B, (iv) depositing NC gate dielectric layer 140 on HK gate dielectric layer 138, as shown in FIGS. 9A-9B, (v) depositing WFM layer 142 on NC gate dielectric layer 140, as shown in FIGS. 9A-9B, (vi) depositing gate metal fill layer 144 on WFM layer 142 to fill gate opening 814, as shown in FIGS. 9A-9B, (v) performing a chemical mechanical polishing (CMP) process on the structures of FIGS. 9A-9B to form the structures of FIGS. 10A-10B, and (vi) removing patterned masking layer 750 from the structures of FIGS. 10A-10B to form the structures of FIGS. 11A-11B.

The etching of nanostructured layers 120-122 can include alternatively etching with a first etching process to remove portions of nanostructured layers 120 through gate opening 814 and a second etching process to remove portions of nanostructured layers 122 through gate opening 814. The first etching process can have a higher etch selectivity towards Si than SiGe and can include a wet etching process with a mixture of ammonia hydroxide ($NH_4OH$) and hydrochloric acid HCl. The second etching process can have a higher etch selectivity towards SiGe than Si and can include a wet etching process with a mixture of sulfuric acid ($H_2SO_4$) and hydrogen peroxide ($H_2O_2$) and/or a mixture of $NH_4OH$, $H_2O_2$, and deionized (DI) water.

The deposition of HK gate dielectric layer 138 can include depositing an HK dielectric material with a thickness of about 1 nm to about 2 nm in an atomic layer deposition (ALD) process using hafnium chloride ($HfCl_4$) as a precursor at a temperature of about 250° C. to about 350° C. The deposition of NC gate dielectric layer 140 can include depositing an NC dielectric material with a thickness of about 1.5 nm to about 2.5 nm in an ALD process with a temperature ranging from about 180° C. to about 325° C. In some embodiments, NC gate dielectric layer 140 is about 1.5 times to about 2.5 times thicker than HK gate dielectric layer 138.

In some embodiments, the deposition of n-type WFM layer 142 can include depositing about 1 nm to about 3 nm thick Al-based metallic layer with an ALD or a chemical vapor deposition (CVD) process using a mixture of titanium tetrachloride ($TiCl_4$) and titanium ethylene aluminum (TEAl) or a mixture of tantalum chloride ($TaCl_5$) and trimethylaluminium (TMA) as precursors at a temperature ranging from about 350° C. to about 450° C. In some embodiments, the Al-based metallic layer can be deposited in an ALD process of about 4 cycles to about 12 cycles, where one cycle can include sequential periods of: (i) first precursor gas (e.g., $TiCl_4$ or $TaCl_5$) flow, (ii) a first gas purging process, (iii) a second precursor gas (e.g., TEAl or TMA) gas flow, and (iv) a second gas purging process.

In some embodiments, the deposition of p-type WFM layer 142 can include the deposition of Al-free metallic layer can include depositing about 1 nm to about 3 nm thick Al-free metallic layer with an ALD or a CVD process using $TiCl_4$ or a mixture of $WCl_5$ and $NH_3$ as precursors at a temperature ranging from about 400° C. to about 450° C. In some embodiments, Al-free metallic layer can be deposited in an ALD process of about 40 cycles to about 100 cycles, where one cycle can include sequential periods of: (i) first precursor gas (e.g., $TiCl_4$ or $WCl_5$) flow, (ii) a first gas purging process, (iii) a second precursor gas (e.g., $NH_3$) gas flow, and (iv) a second gas purging process.

In some embodiments, the deposition of gate metal fill layer 144 can include depositing a fluorine-free metal layer with an ALD process using $WCl_5$ or a mixture of $WCl_6$ and $H_2$ as precursors at a temperature ranging from about 400° C. to about 500° C. In some embodiments, the fluorine-free metal layer can be deposited in an ALD process of about 160 cycles to about 320 cycles, where one cycle can include sequential periods of: (i) first precursor gas (e.g., $WCl_5$ or $WCl_6$) flow, (ii) a first gas purging process, (iii) a second precursor gas (e.g., $H_2$) gas flow, and (iv) a second gas purging process. Other methods of depositing HK gate dielectric layer 138, NC gate dielectric layer 140, WFM layer 142, and gate metal fill layer 144 are within the scope of the present disclosure.

Figure 10A:
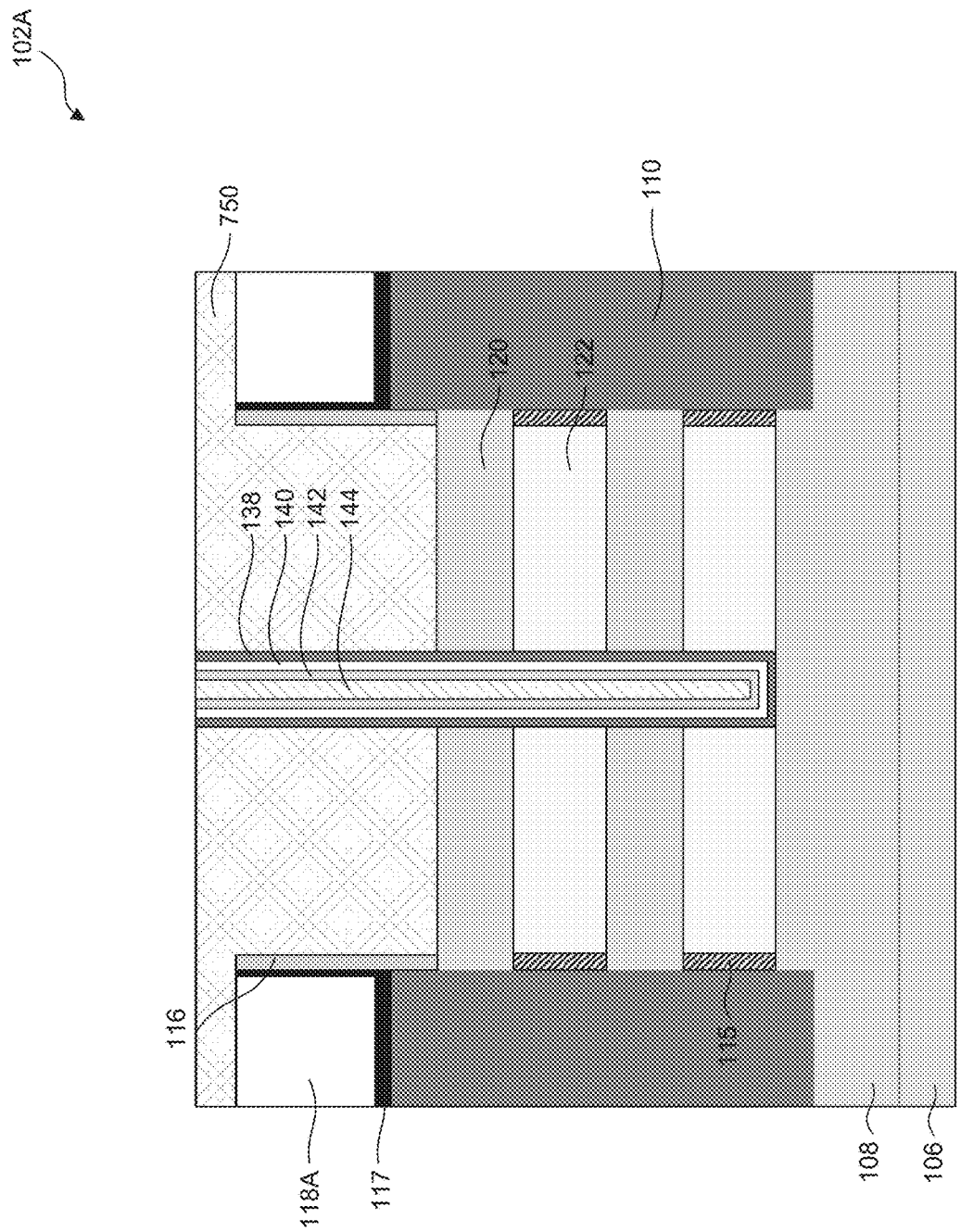
Figure 10B:
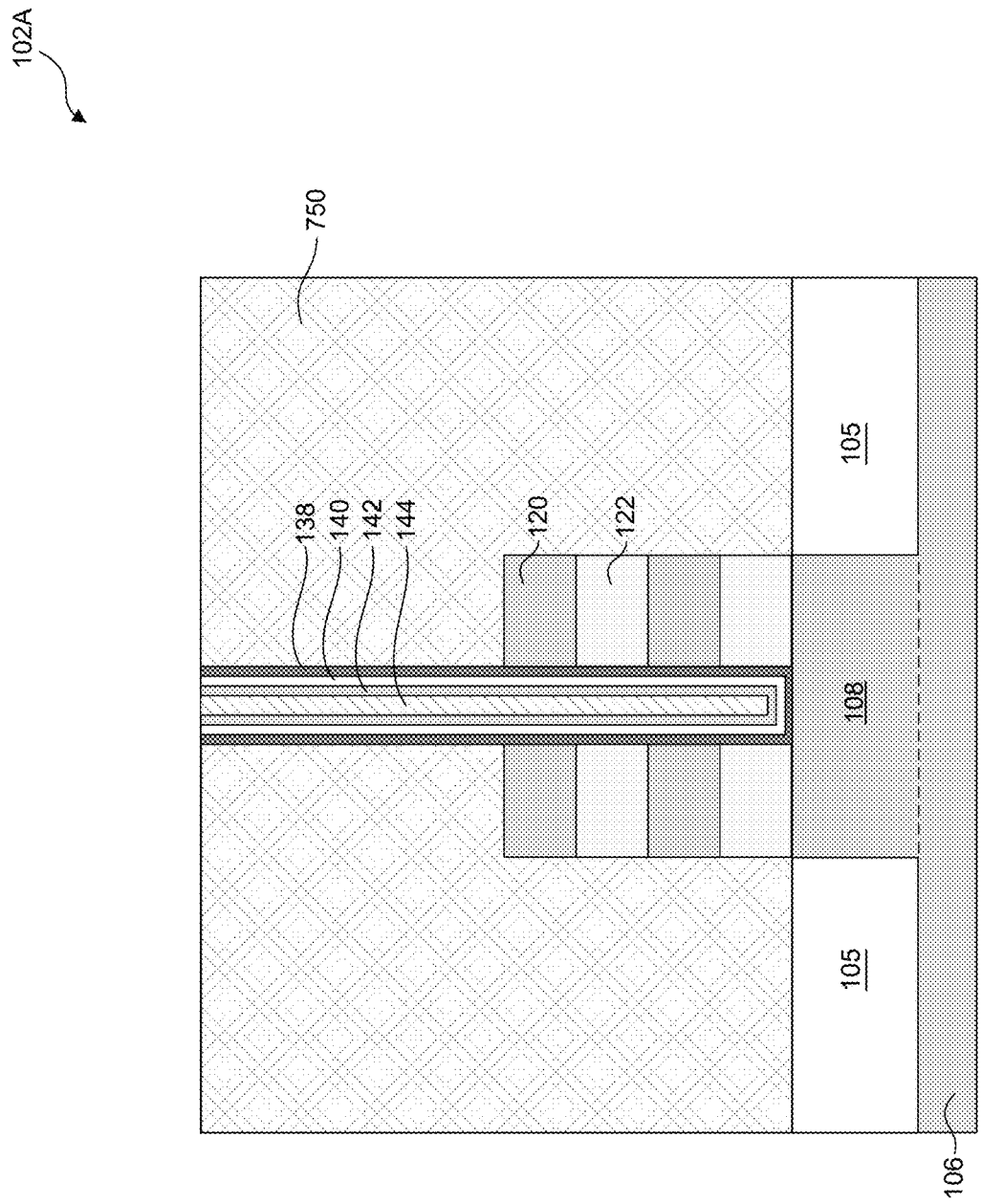
Figure 11A:
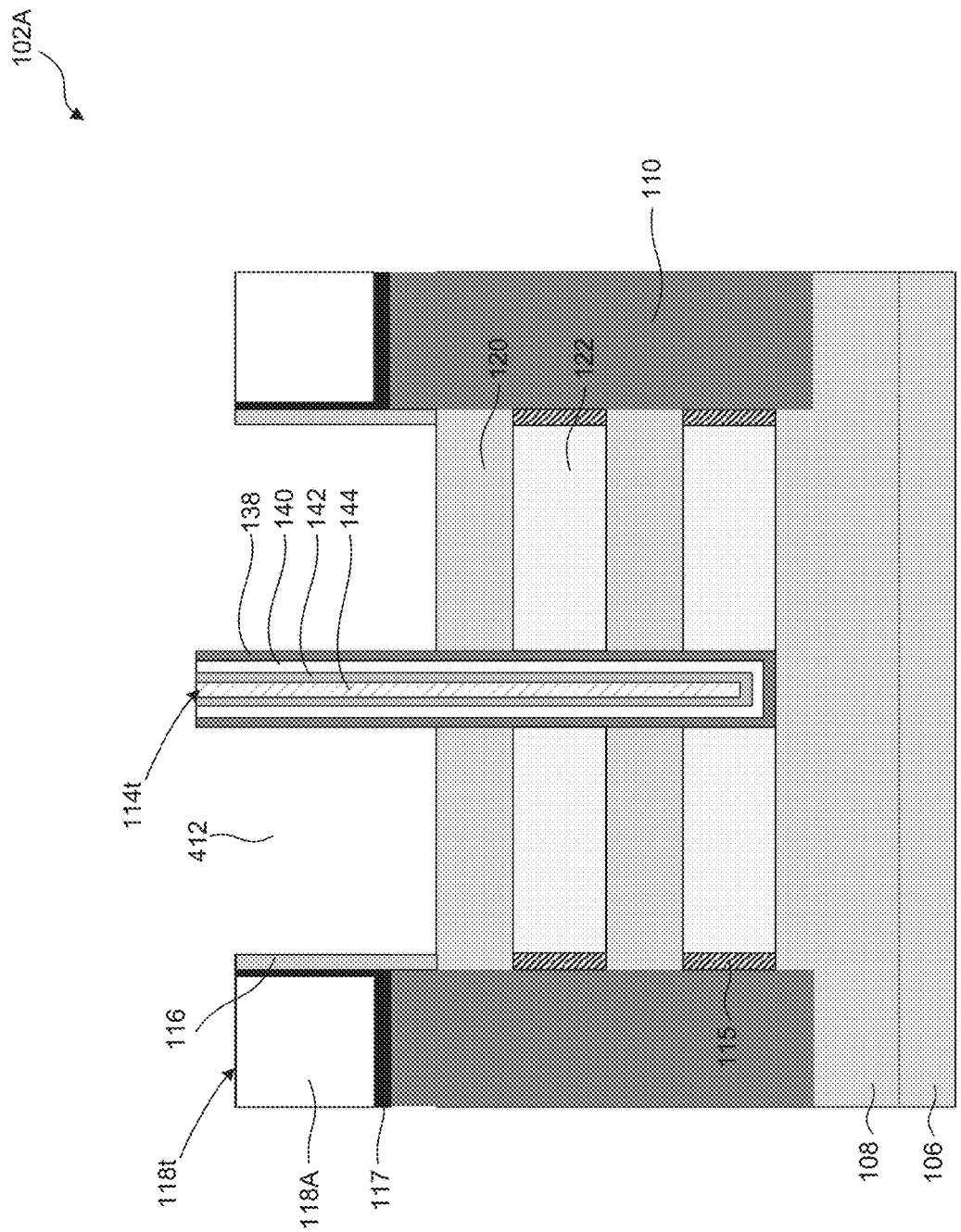
Figure 11B:
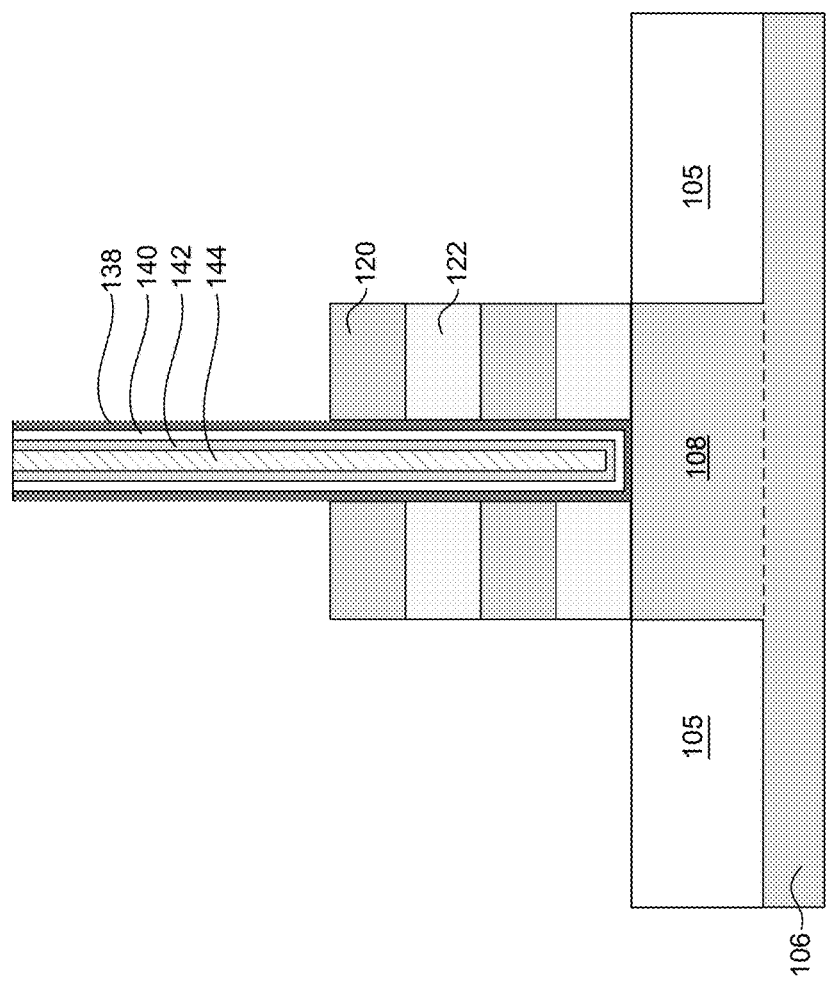

The CMP process can substantially coplanarize top surfaces of HK gate dielectric layer 138, NC gate dielectric layer 140, WFM layer 142, and gate metal fill layer 144 with a top surface of patterned masking layer 750, as shown in FIGS. 10A-10B. After the CMP process and the removal of patterned masking layer 750, top surface 114t of TCG structure 114 is non-coplanar with top surface 118t of ILD layer 118A and extends above top surface 118t.

Figure 12A:
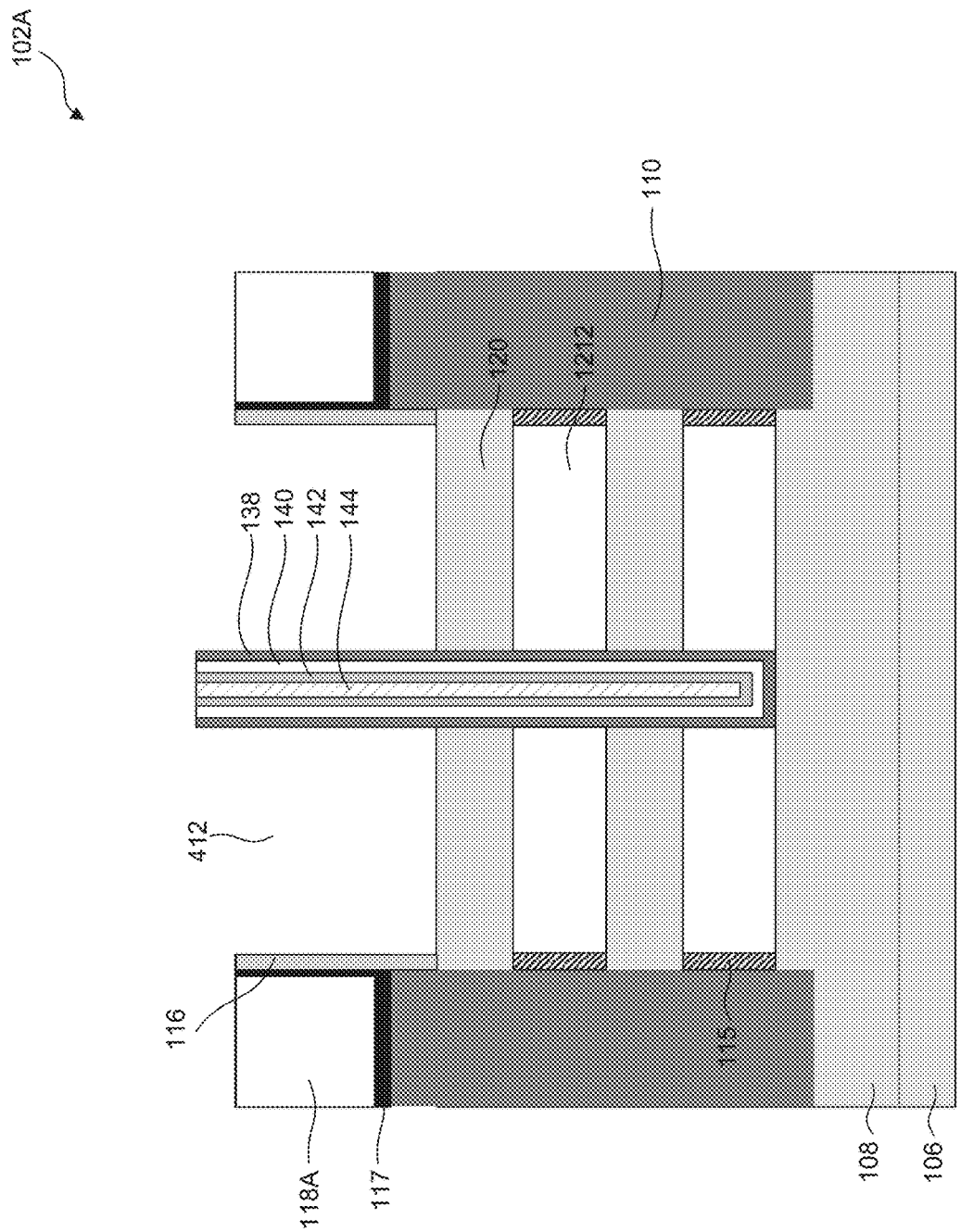
Figure 12B:
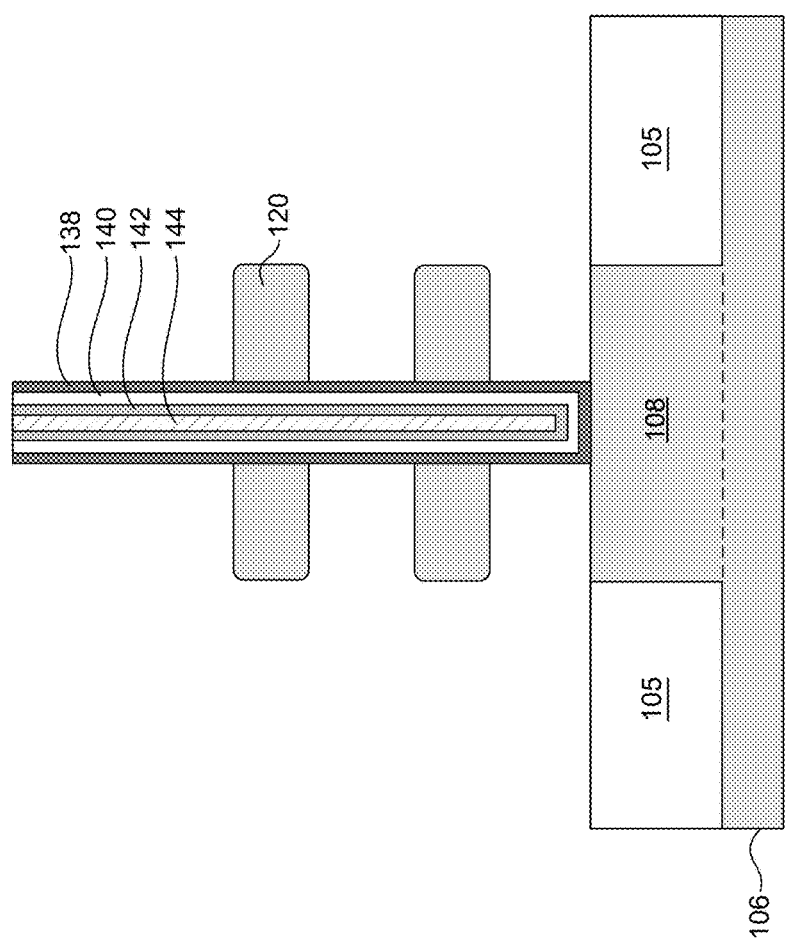
Figure 12B:
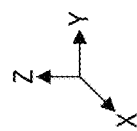

Referring to FIG. 2, in operation 225, second gate openings are formed within the superlattice structure. For example, as shown in FIGS. 12A-12B, second gate openings 1212 are formed within superlattice structure 119. The formation of second gate openings 1212 can include etching nanostructured layers 122 from the structures of FIGS. 11A-11B to form the structures of FIGS. 12A-12B. The etching of nanostructured layers 122 can include a wet etching process with a mixture of $H_2SO_4$ and hydrogen peroxide $H_2O_2$ and/or a mixture of $NH_4OH$, $H_2O_2$, and DI water.

Figure 13A:
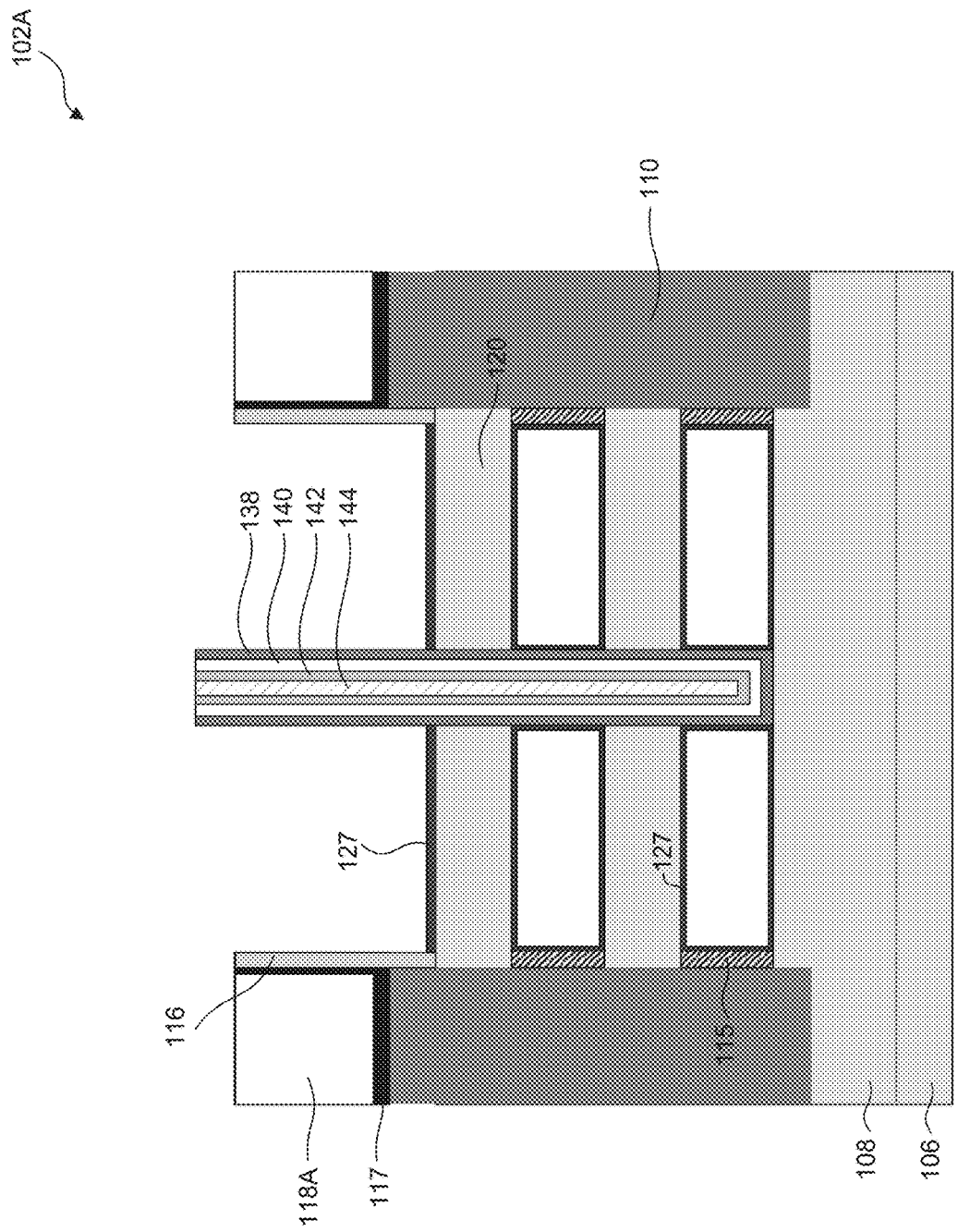
Figure 13B:
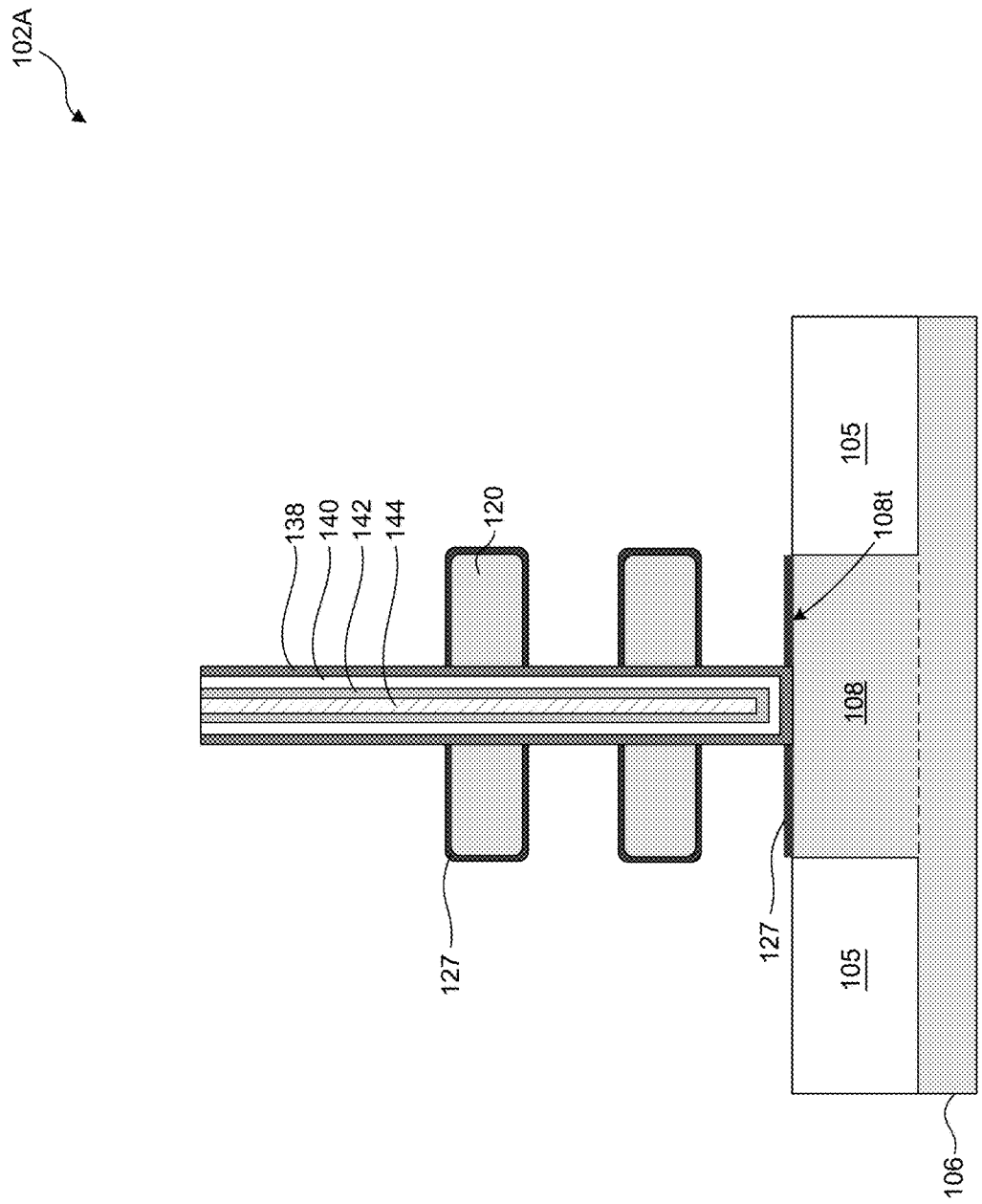
Figure 14A:
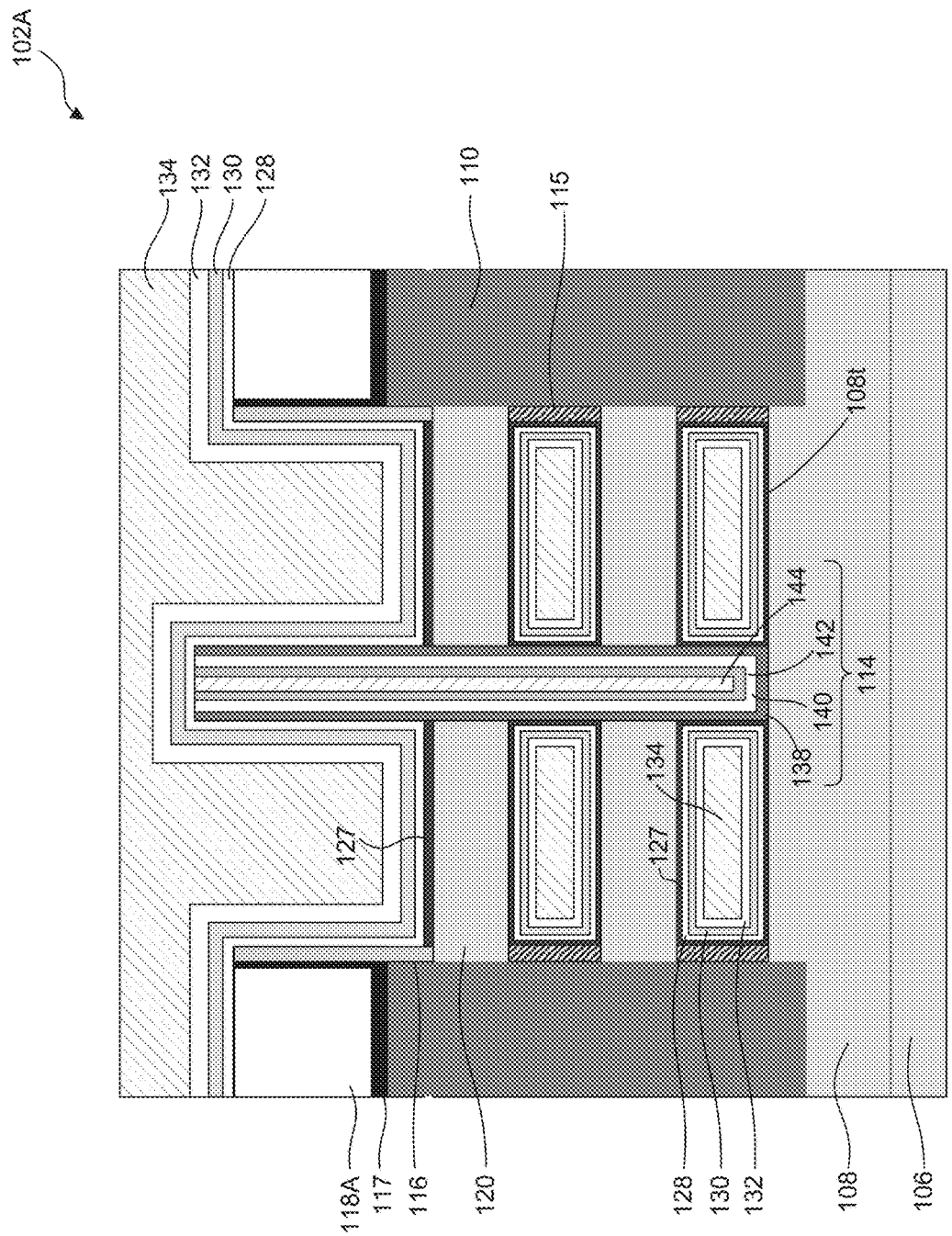
Figure 14B:
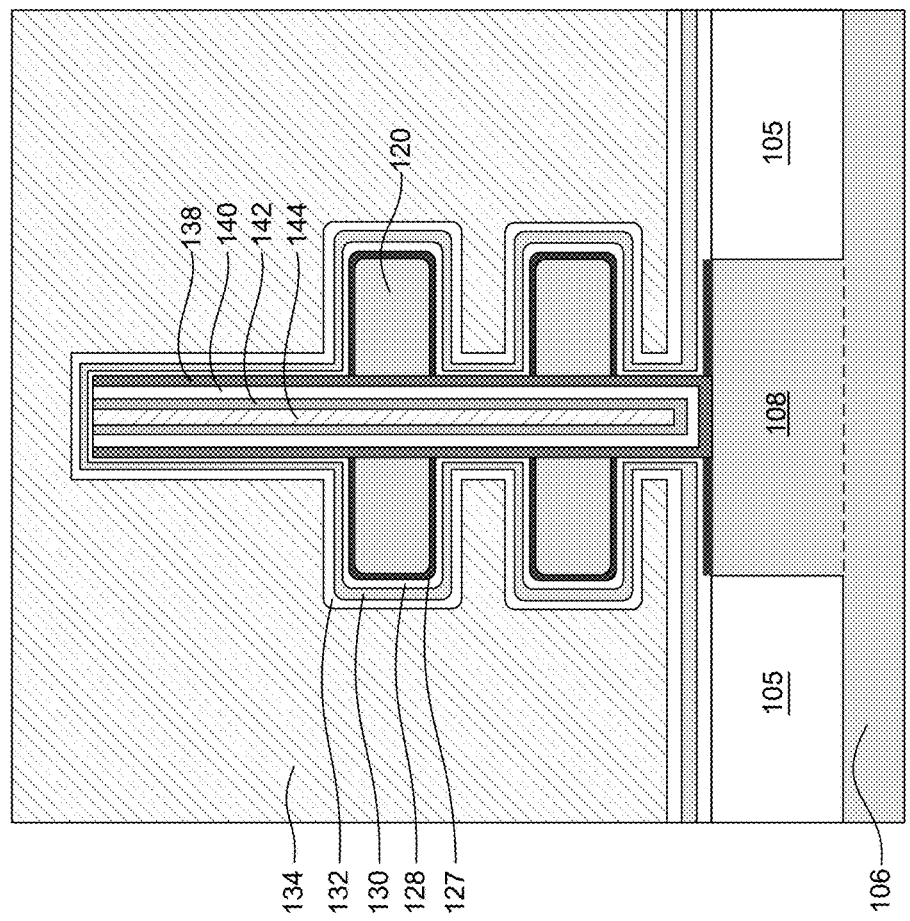

Referring to FIG. 2, in operation 230, GAA structure is formed within the first and second gate openings. For example, as described with reference to FIGS. 13A-15B, GAA structure 112 is formed within first and second gate openings 412 and 1212. The formation of GAA structure 112 can include sequential operations of (i) forming IO layer 127 on the exposed regions of nanostructured layers 120 and fin structure 108, as shown in FIGS. 13A-13B, (ii) depositing HK gate dielectric layer 128 on the structures of FIGS. 13A-13B, as shown in FIGS. 14A-14B, (iv) depositing NC gate dielectric layer 130 on HK gate dielectric layer 128, as shown in FIGS. 14A-14B, (v) depositing WFM layer 132 on NC gate dielectric layer 130, as shown in FIGS. 14A-14B, (vi) depositing gate metal fill layer 134 on WFM layer 132 to fill gate openings 412 and 1212, as shown in FIGS. 14A-14B, and (v) performing a CMP process on the structures of FIGS. 14A-14B to form the structures of FIGS. 15A-15B.

In some embodiments, IO layer 127 can be formed by exposing the structures of FIGS. 12A-12B to an oxidizing ambient. The oxidizing ambient can include a combination of ozone (03), a mixture of ammonia hydroxide, hydrogen peroxide, and water, and/or a mixture of hydrochloric acid, hydrogen peroxide, and water. The deposition of HK gate dielectric layer 128, NC gate dielectric layer 130, WFM layer 132, and gate metal fill layer 134 can be similar to the deposition processes described for HK gate dielectric layer 138, NC gate dielectric layer 140, WFM layer 142, and gate metal fill layer 144, respectively, in operation 220. The deposition thickness of HK gate dielectric layer 128, NC gate dielectric layer 130, WFM layer 132, and gate metal fill layer 134 can be equal to or different from the deposition thickness of HK gate dielectric layer 138, NC gate dielectric layer 140, WFM layer 142, and gate metal fill layer 144, respectively.

Figure 15A:
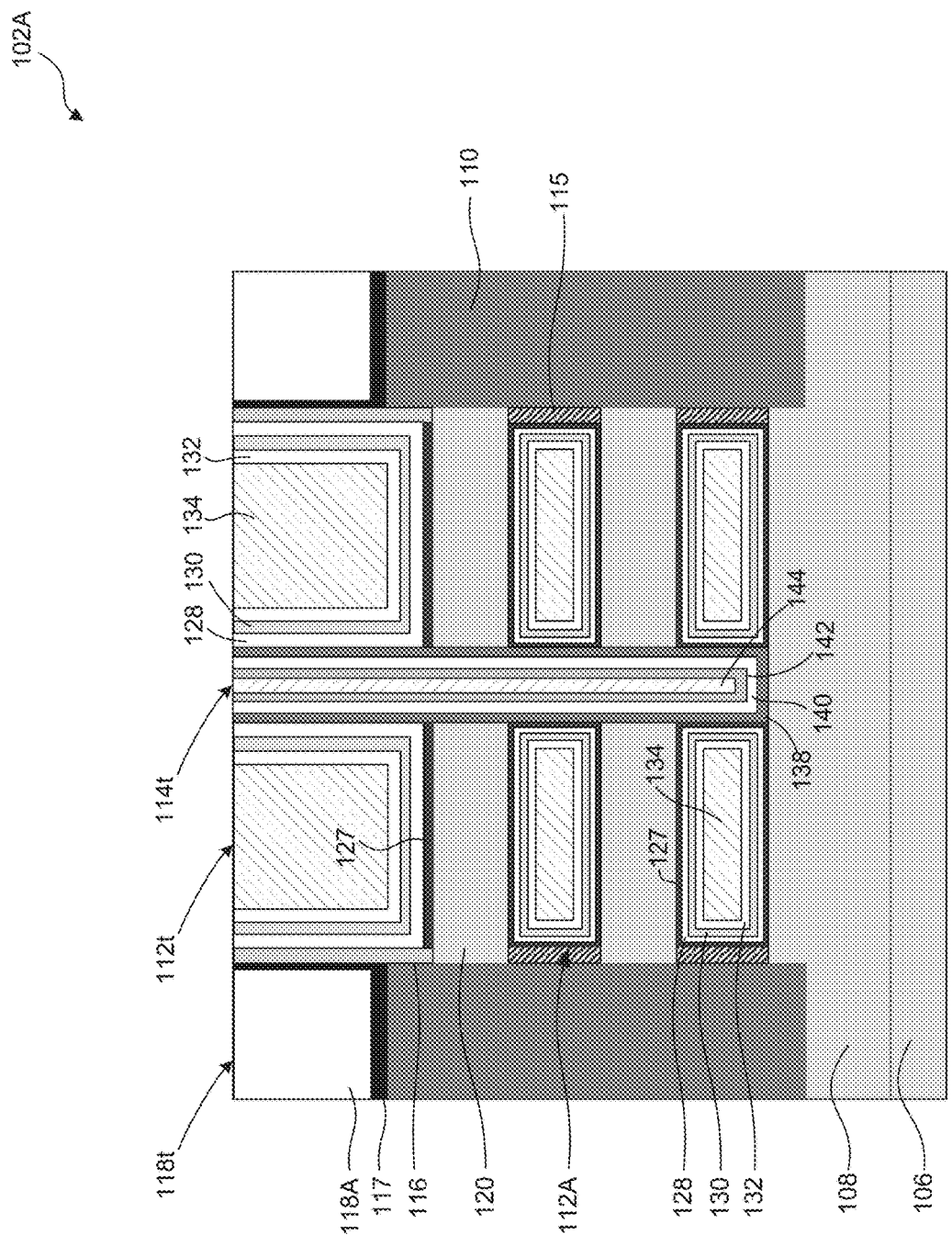
Figure 15B:
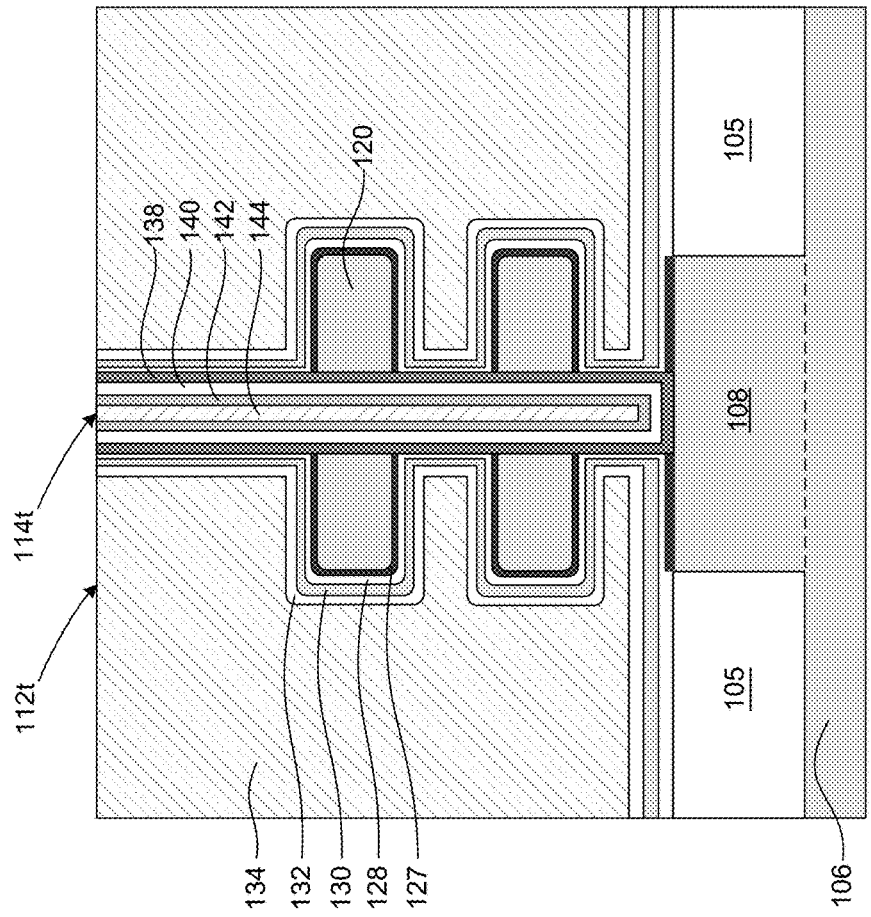

The CMP process after the formation of gate metal fill layer 144 can substantially coplanarize top surfaces of HK gate dielectric layers 128 and 138, NC gate dielectric layers 130 and 140, WFM layers 132 and 142, and gate metal fill layers 134 and 144 with top surface 118t of ILD layer 118A, as shown in FIGS. 15A-15B.

Figure 16A:
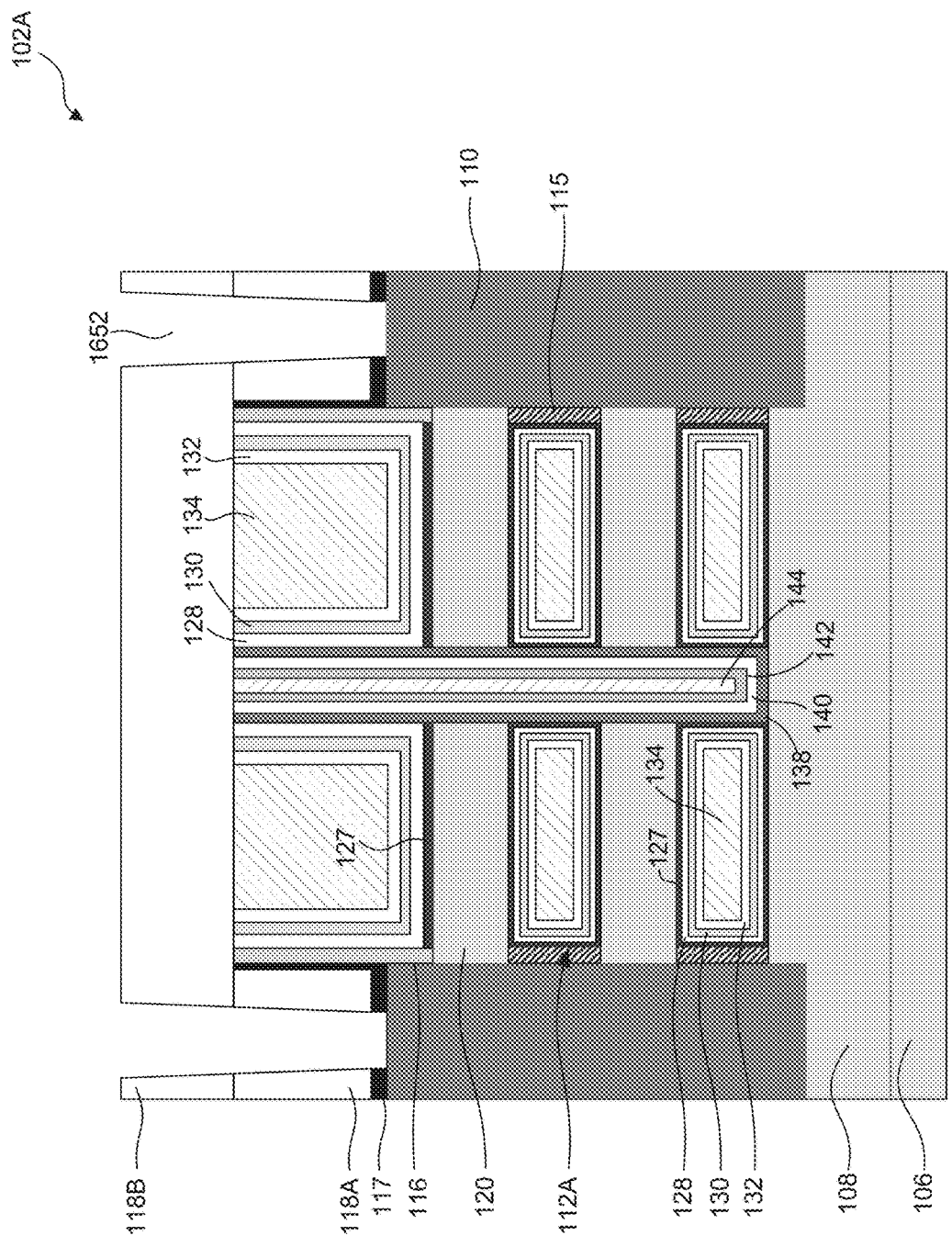
Figure 16B:
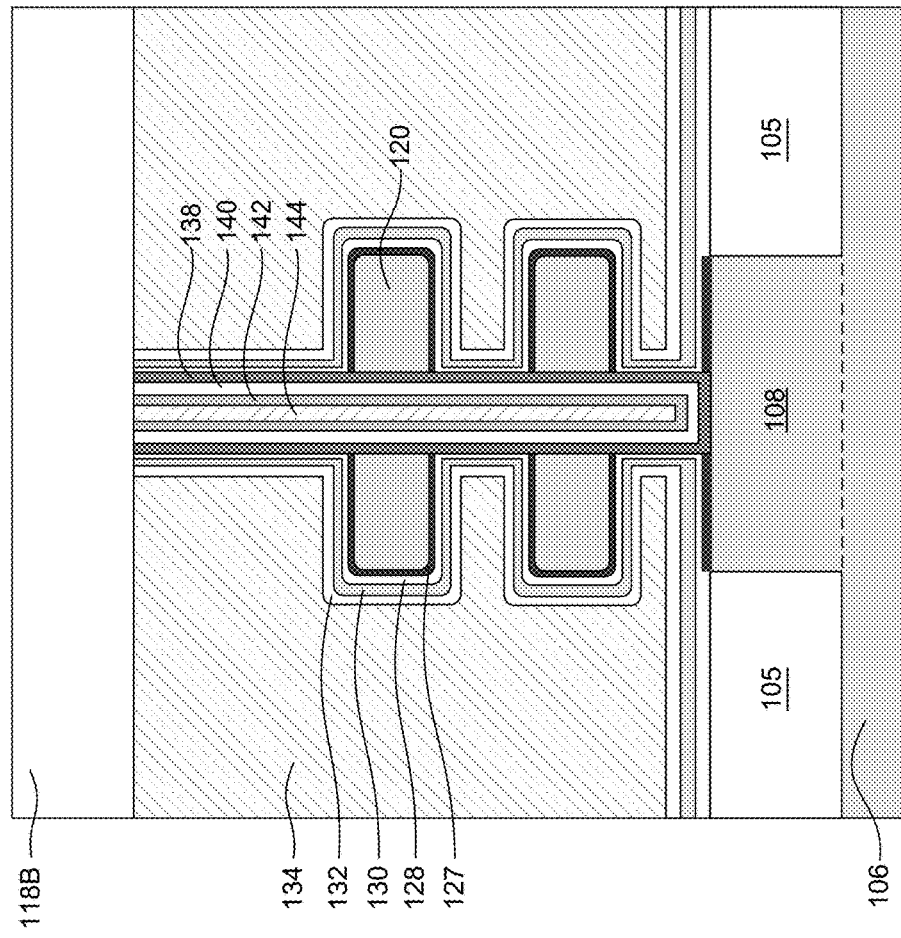
Figure 17A:
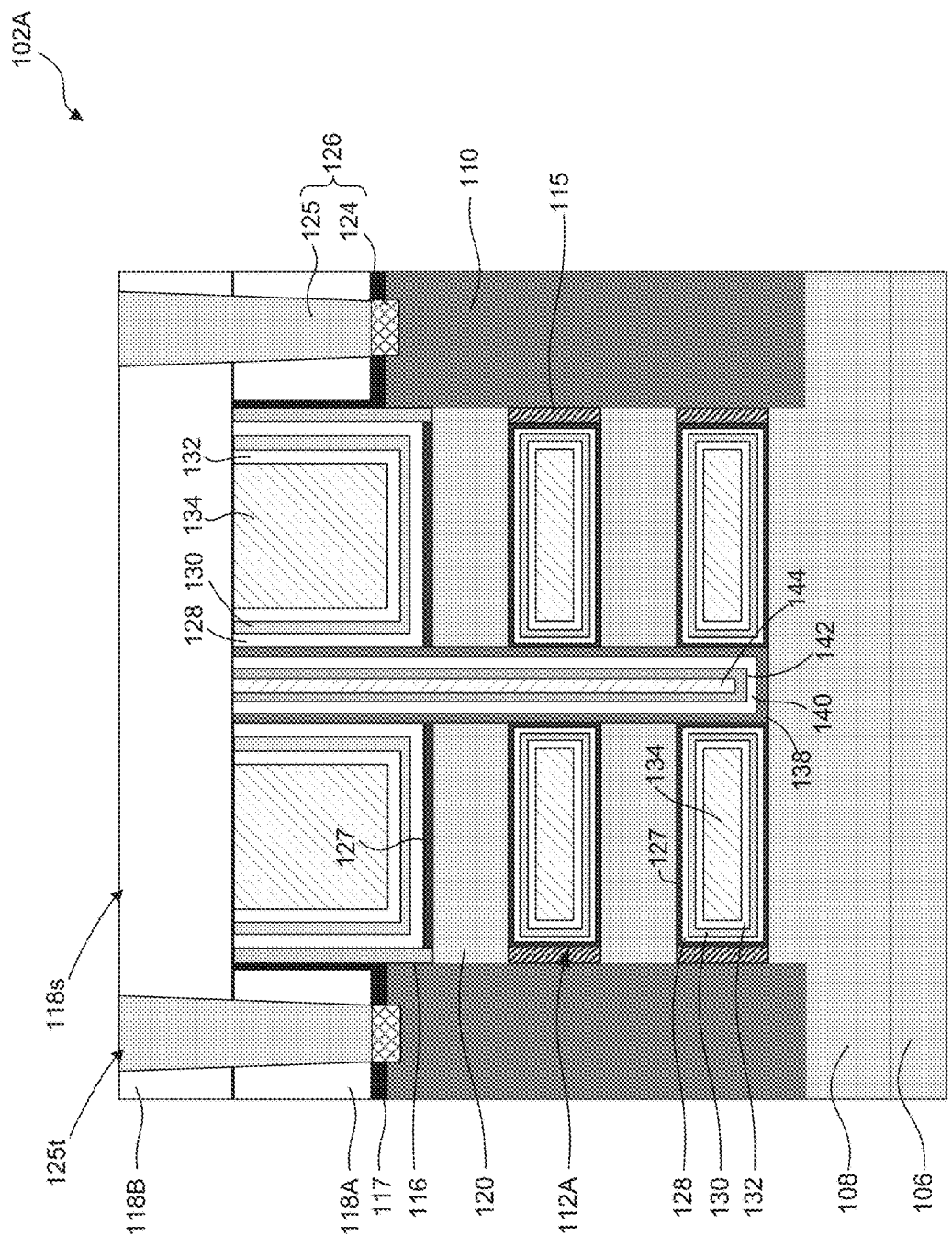
Figure 17B:
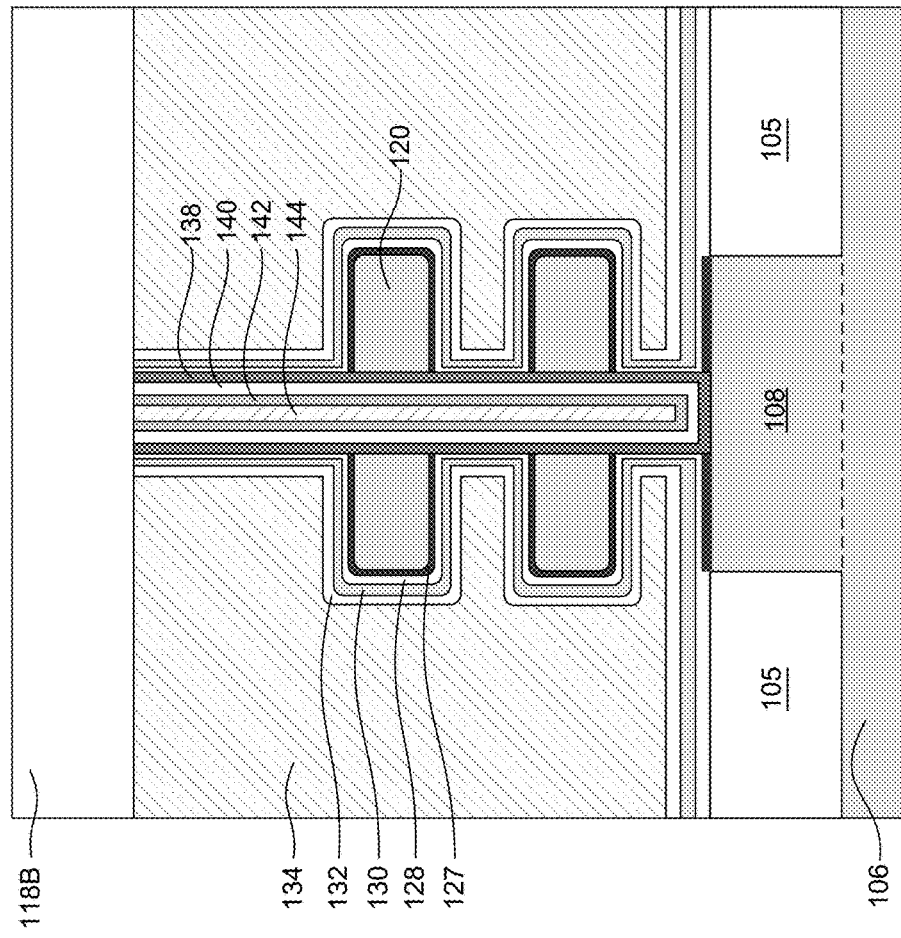

Referring to FIG. 2, in operation 235, S/D contact structures are formed on the S/D regions. For example, as described with reference to FIGS. 16A-17B, S/D contact structures 126 are formed on S/D regions 110. The formation of S/D contact structures 126 can include sequential operations of (i) depositing ILD layer 118B on the structures of FIGS. 15A-15B, (ii) forming contact openings 1652 within ILD layers 118A-118B and ESL 117, as shown in FIG. 16A, (iii) forming silicide layers 124 within contact openings 1652, as shown in FIG. 17A, (iv) depositing contact plugs 125 on silicide layers 124 to fill contact openings 1652, and (v) performing a CMP process on the deposited contact plugs 125 to substantially coplanarize top surfaces 125t of contact plugs 125 with top surface 118s of ILD layer 118B, as shown in FIG. 17A.

Figure 18A:
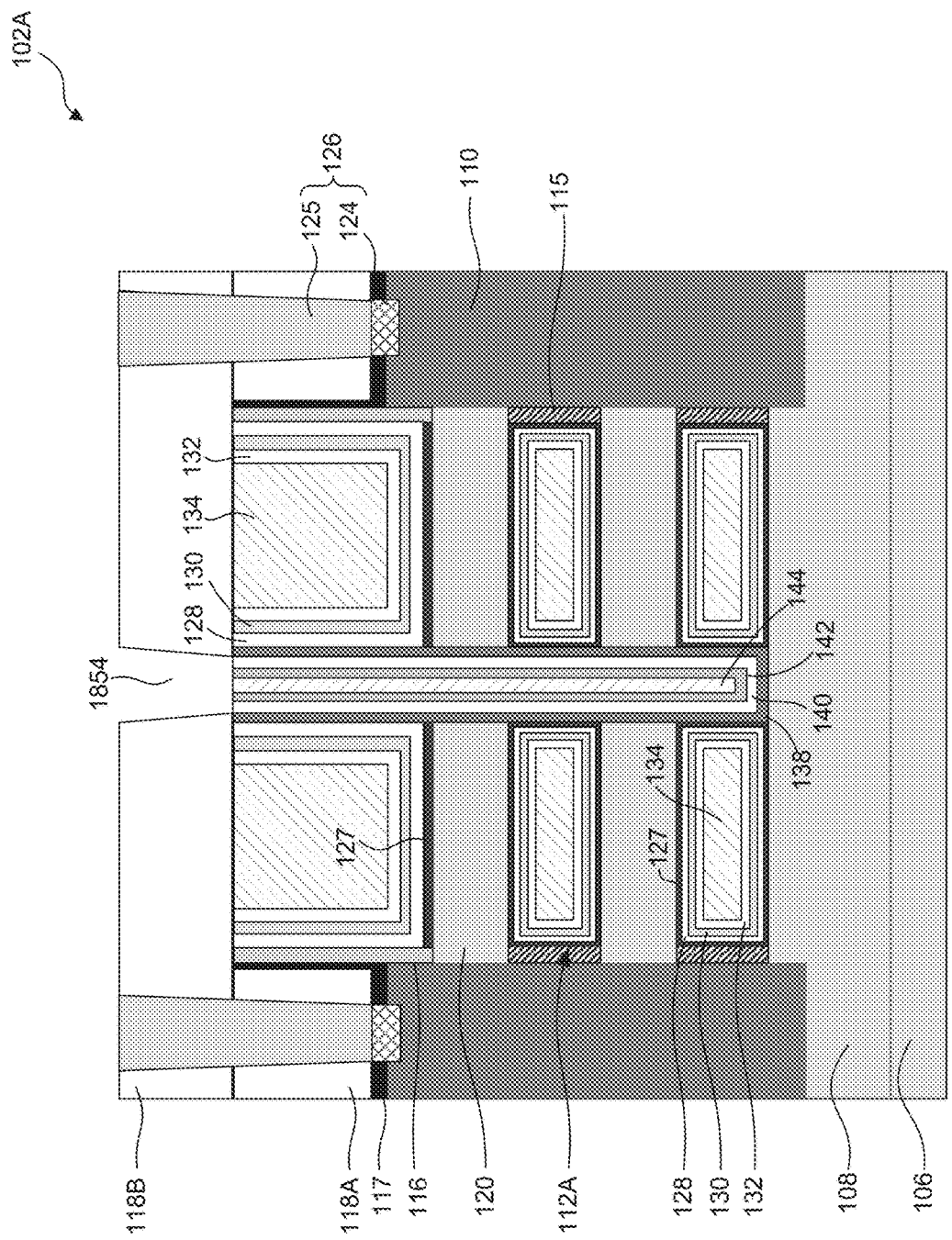
Figure 18B:
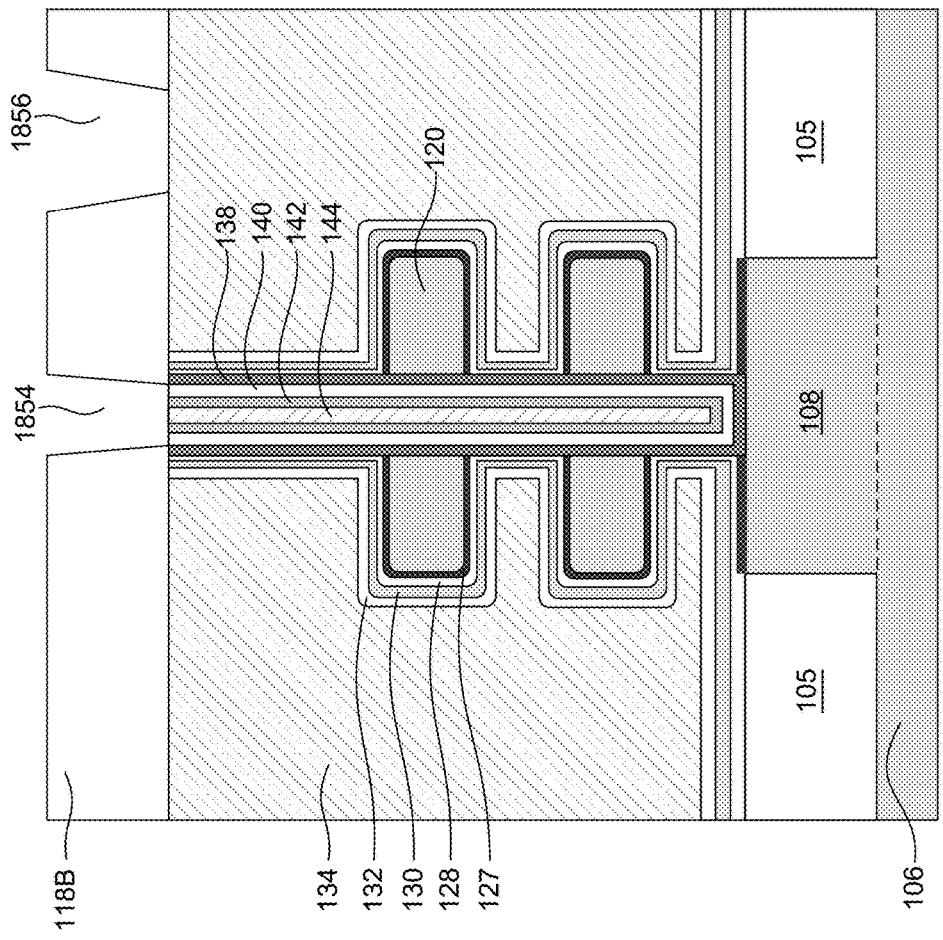
Figure 19A:
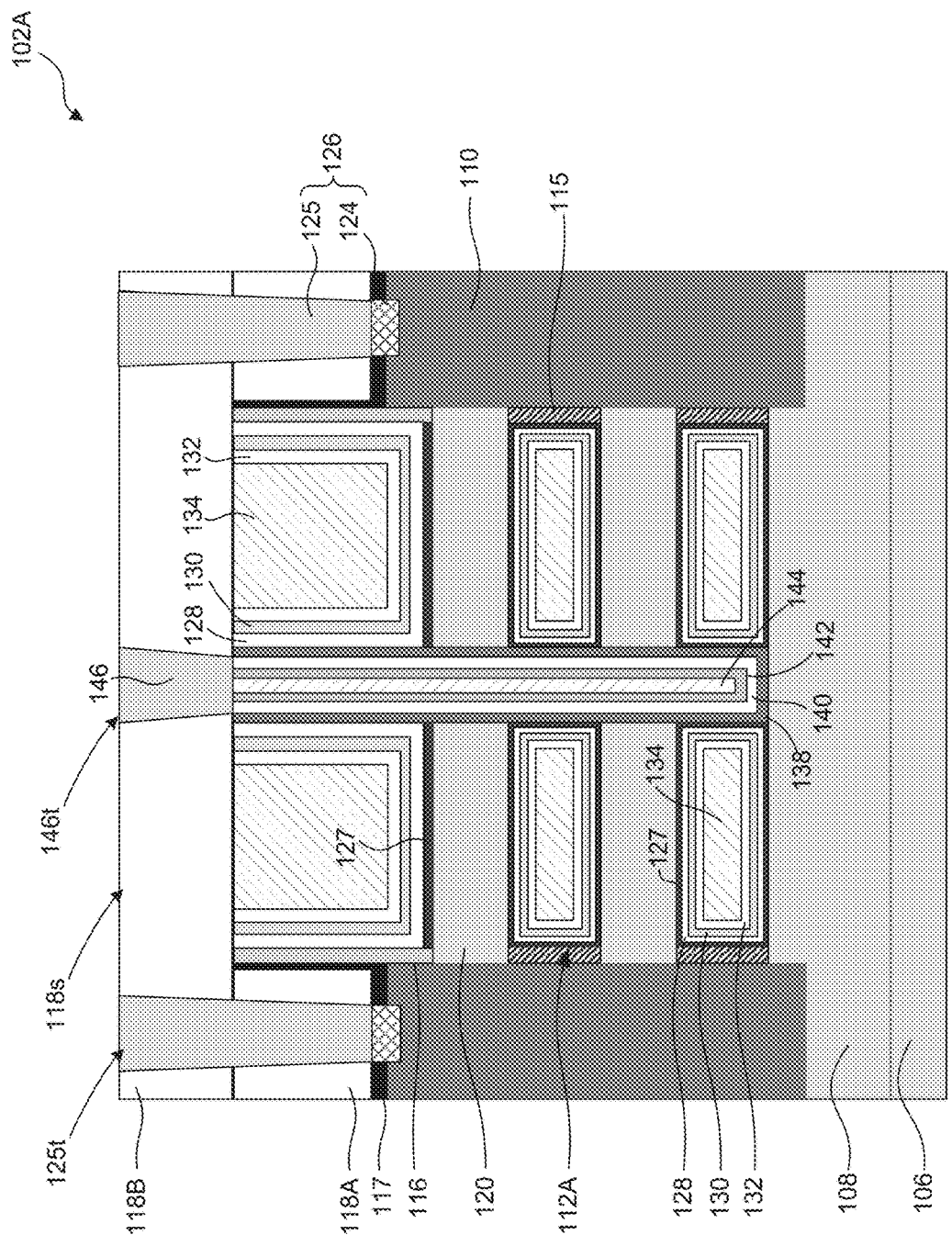
Figure 19B:
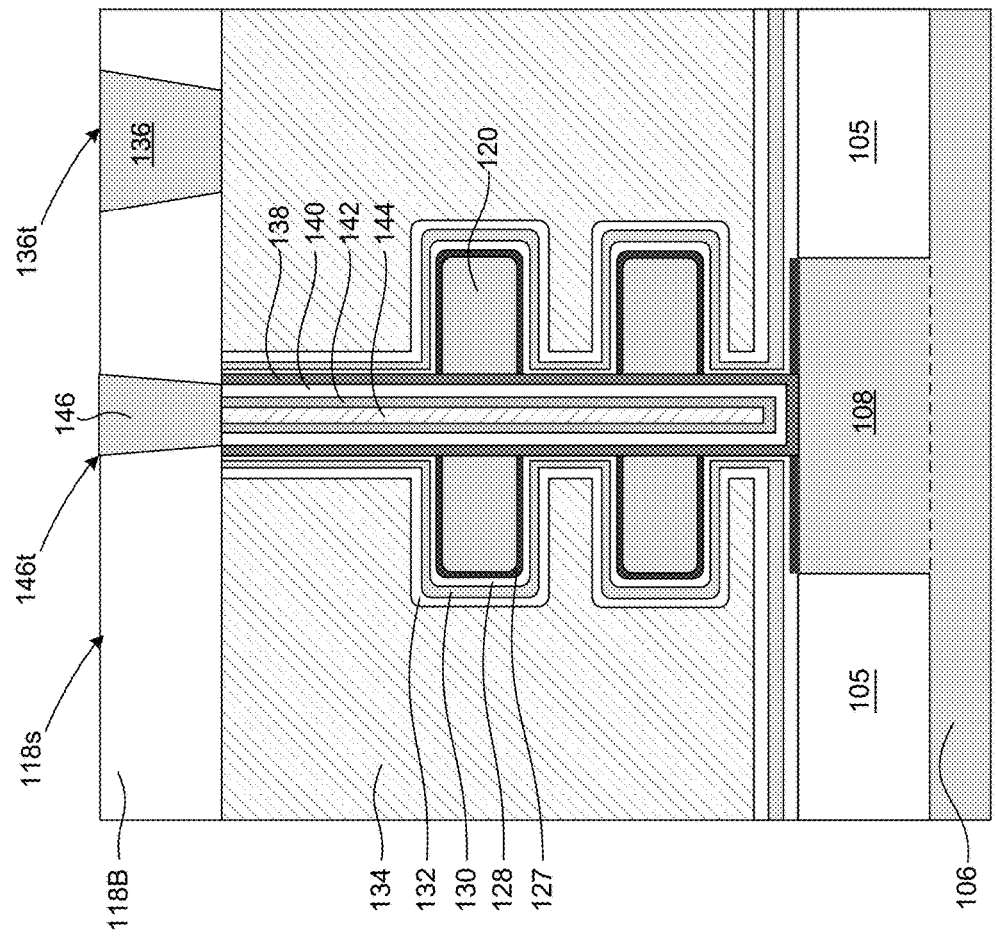
Figure 19B:
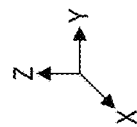

Referring to FIG. 2, in operation 240, gate contact structures are formed on the TCG structure and GAA structure. For example, as described with reference to FIGS. 18A-19B, gate contact structures 136 and 146 are formed on GAA structure and TCG structure, respectively. The formation of gate contact structures 136 and 146 can include sequential operations of (i) forming contact openings 1854 and 1856 within ILD layer 118B, as shown in FIGS. 18A-18B, (ii) depositing conductive materials on the structures of FIGS. 18A-18B to fill contact openings 1854 and 1856, and (iii) performing a CMP process on the deposited conductive materials to substantially coplanarize top surfaces 136t and 146t with top surfaces 125t and 118s, as shown in FIGS. 19A-19B.

In some embodiments, a method similar to method 200 can be used to fabricate an array of TCG structures 114 in FET 102A, as shown in FIGS. 1G-1I. For the formation of an array of TCG structures 114, an array of openings similar to openings 714 and 814 can be formed within patterned masking layer 750 and superlattice structure 119 to deposit HK gate dielectric layer 138, NC gate dielectric layer 140, WFM layer 142, and gate metal fill layer 144 in operation 220, instead of forming single openings within patterned masking layer 750 and superlattice structure 119, as described with reference to FIGS. 7A-11B. In some embodiments, the array of openings can have diameters (or widths along an X-axis and/or Y-axis) equal to or different from each other.

The present disclosure provides example FETs (e.g., GAA FETs 102A-102B) with multi-Vt functionality and example methods of forming the same. The multi-Vt functionality can be provided by a plurality of gate structures formed between a pair of S/D regions (e.g., S/D regions 110). In some embodiments, a FET (e.g., FET 102A) with multi-Vt functionality can include one or more through-channel gate (TCG) structures (e.g., TCG structure 114) and a gate-all-around (GAA) structure (e.g., GAA structure 112) that are disposed between a pair of S/D regions. The TCG structures can extend through nanostructured channel regions (e.g., nanostructured channel regions 120) of the FET and can be disposed on a fin structure (e.g., fin structure 108) of the FET underlying the nanostructured channel regions. Portions of the TCG structures can be alternatively surrounded by the nanostructured channel regions and the GAA structure.

In some embodiments, the TCG structures can include negative capacitance gate dielectric layers (e.g., NC gate dielectric layer 140) to prevent or reduce parasitic capacitance between the TCG structures and the GAA structures. By controlling the voltages applied to the GAA structure and the one or more TCG structures, the threshold voltage of the FET can be modulated to achieve different threshold voltages of the FET. With the use of the one or more TCG structures, the threshold voltage of the FET can be tuned to higher voltages during a standby mode of the FET to reduce the leakage current, thus reducing power consumption and improving device performance. In addition, with the use of TCG structures, the number of FETs needed to achieve multiple threshold voltages in an integrated circuit can be reduced, thus reducing device area and manufacturing cost.

In some embodiments, a method includes forming a superlattice structure with first and second nanostructured layers arranged in an alternating configuration on a fin structure, forming a source/drain (S/D) region on the fin structure, forming a first gate structure through the superlattice structure, forming a second gate structure surrounding the first gate structure about a first axis and surrounding the first nanostructured layers about a second axis different from the first axis, and forming contact structures on the first and second gate structures.

In some embodiments, a method includes forming a superlattice structure with first and second nanostructured layers arranged in an alternating configuration on a fin structure, forming a polysilicon structure on the superlattice structure, forming a source/drain (S/D) region on the fin structure, forming an array of first gate structures through the superlattice structure, and forming a second gate structure surrounding the array of first gate structures about a first axis and surrounding the first nanostructured layers about a second axis different from the first axis.

In some embodiments, a semiconductor device includes a substrate, a fin structured disposed on the substrate, a stack of nanostructured channel regions disposed on the fin structure, a first gate structure disposed within the stack of nanostructured channel regions, a second gate structure surrounds the first gate structure about a first axis and surrounds the nanostructured channel regions about a second axis different from the first axis, and first and second contact structures disposed on the first and second gate structures, respectively.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a superlattice structure with first and second nanostructured layers arranged in an alternating configuration on a fin structure disposed on a substrate;
   forming a source/drain (SID) region on the fin structure;
   etching the first and second nanostructured layers to form a gate opening in the superlattice structure and to expose a top surface portion of the fin structure in the gate opening, wherein a first portion of the gate opening is in the first nanostructured layer and a second portion of the gate opening is in the second nanostructured laver;
   forming a first gate structure in the gate opening and directly on the top surface portion of the fin structure;
   forming a second gate structure surrounding the first gate structure about a first axis and surrounding the first nanostructured layers about a second axis different from the first axis; and
   forming contact structures on the first and second gate structures.

2. The method of claim 1, wherein forming the superlattice structure comprises epitaxially growing first and second nanostructured layers on the substrate.

3. The method of claim 1, wherein forming the first gate structure comprises depositing a dielectric layer directly on the top surface portion of the fin structure.

4. The method of claim 1, wherein forming the first gate structure comprises depositing concentric layers of first and second dielectric materials in the gate opening, wherein the first and second dielectric materials are different from each other.

5. The method of claim 1, wherein forming the first gate structure comprises depositing concentric layers of a dielectric material and a metallic material in the gate opening.

6. The method of claim 1, wherein forming the first gate structure comprises:
   depositing a high-k gate dielectric layer in the gate opening; and
   depositing a negative capacitance (NC) gate dielectric layer on the high-k gate dielectric layer, wherein materials of the high-k gate dielectric layer and the NC gate dielectric layer are different from each other.

7. The method of claim 1, wherein forming the first gate structure comprises:
   forming a patterned masking layer with an opening on the superlattice structure;
   etching exposed regions of the superlattice structure through the opening to form the gate opening in the superlattice structure;
   depositing a gate dielectric layer and a metal layer in the opening and the gate opening; and
   performing a polishing process to substantially coplanarize top surfaces of the gate dielectric layer and the metal layer with a top surface of the patterned masking layer.

8. The method of claim 1, wherein forming the second gate structure comprises etching the second nanostructured layers from the superlattice structure.

9. The method of claim 1, wherein forming the second gate structure comprises:
   depositing a high-k gate dielectric layer surrounding the first nanostructured layers and portions of the first gate structure that are not covered by the first nanostructured layers; and
   depositing a negative capacitance (NC) gate dielectric layer on the high-k gate dielectric layer, wherein materials of the high-k gate dielectric layer and the NC gate dielectric layer are different from each other.

10. A method, comprising:
    forming a superlattice structure with first and second nanostructured layers arranged in an alternating configuration on a fin structure;
    forming a polysilicon structure on the superlattice structure;
    forming a source/drain (SID) region on the fin structure;
    forming an array of first gate structures in an array of gate openings extending through the first and second nanostructured layers of the superlattice structure; and
    forming a second gate structure surrounding the array of first gate structures about a first axis and surrounding the first nanostructured layers about a second axis different from the first axis.

11. The method of claim 10, wherein forming the array of first gate structures comprises:
    etching the first and second nanostructured layers to form the array of gate openings in the superlattice structure; and depositing concentric layers of a dielectric material and a metallic material in the array of gate openings.

12. The method of claim 10, wherein forming the array of first gate structures comprises:
removing the polysilicon structure to form an opening on the superlattice structure;
forming a patterned masking layer with an array of openings in the opening on the superlattice structure;
etching exposed regions of the superlattice structure through the array of openings to form the array of gate openings in the superlattice structure; and
depositing concentric layers of a dielectric material and a metallic material in the array of openings and in the array of gate openings.

13. The method of claim 10, wherein forming the array of first gate structures comprises forming the array of gate openings, wherein each opening of the array of gate openings has a diameter different from each other.

14. The method of claim 10, wherein forming the array of first gate structures comprises forming each first gate structure of the array of first gate structures with a diameter that is different from other first gate structures of the array of first gate structures.

15. A semiconductor device, comprising:
a substrate;
a fin structure disposed on the substrate;
a stack of nanostructured channel regions disposed on the fin structure;
a source/drain (S/D) region disposed on the fin structure;
a first gate structure disposed in the stack of nanostructured channel regions and comprising a first gate dielectric layer;
a second gate structure surrounding the first gate structure about a first axis and surrounding the stack of nanostructured channel regions about a second axis different from the first axis, wherein the second gate structure comprises a second gate dielectric layer surrounding and in direct contact with the first gate dielectric layer; and
first and second contact structures disposed on the first and second gate structures, respectively.

16. The semiconductor device of claim 15, wherein the stack of nanostructured channel regions surrounds portions of the first gate structure that are not surrounded by the second gate structure.

17. The semiconductor device of claim 15, wherein the first gate structure comprises a high-k dielectric layer and a negative capacitance (NC) gate dielectric layer disposed on the high-k gate dielectric layer, and
wherein materials of the high-k gate dielectric layer and the NC gate dielectric layer are different from each other.

18. The semiconductor device of claim 15, wherein the first gate structure comprises a negative capacitance gate dielectric layer and a work function metal layer disposed on the negative capacitance gate dielectric layer.

19. The semiconductor device of claim 15, wherein the first and second gate dielectric layers are different from each other.

20. The semiconductor device of claim 15, wherein the first gate structure is in physical contact with a top surface of the fin structure.

* * * * *

UNITED STATES PATENT AND TRADEMARK OFFICE
CERTIFICATE OF CORRECTION

| | |
|---|---|
| PATENT NO. | : 12,027,583 B2 |
| APPLICATION NO. | : 17/320170 |
| DATED | : July 2, 2024 |
| INVENTOR(S) | : Yang et al. |

Page 1 of 2

It is certified that error appears in the above-identified patent and that said Letters Patent is hereby corrected as shown below:

On the Title Page

Column 1, in Item (72), in "Inventors", Line 1, delete "Shinchu" and insert -- Hsinchu --, therefor.

Column 1, in Item (72), in "Inventors", Line 2, delete "Shinchu" and insert -- Hsinchu --, therefor.

In the Specification

In Column 7, Line 39, delete "(iii)" and insert -- (ii) --, therefor.

In Column 7, Line 40, delete "(iv)" and insert -- (iii) --, therefor.

In Column 7, Line 41, delete "(v)" and insert -- (iv) --, therefor.

In Column 8, Line 17, delete "Si ranging" and insert -- S1 ranging --, therefor.

In Column 11, Line 29, delete "(iv)" and insert -- (iii) --, therefor.

In Column 11, Line 31, delete "(v)" and insert -- (iv) --, therefor.

In Column 11, Line 33, delete "(vi)" and insert -- (v) --, therefor.

In Column 11, Line 35, delete "(v)" and insert -- (vii) --, therefor.

In Column 11, Line 41, delete "(03)," and insert -- ($O_3$), --, therefor.

In the Claims

In Column 13, Claim 1, Line 52, delete "(SID)" and insert -- (S/D) --, therefor.

Signed and Sealed this
Third Day of December, 2024

Katherine Kelly Vidal
*Director of the United States Patent and Trademark Office*

CERTIFICATE OF CORRECTION (continued)
U.S. Pat. No. 12,027,583 B2

In Column 13, Claim 1, Line 59, delete "laver;" and insert -- layer; --.

In Column 14, Claim 10, Line 55, delete "(SID)" and insert -- (S/D) --, therefor.

In Column 15, Claim 15, Line 29, delete "(SID)" and insert -- (S/D) --, therefor.